(12) United States Patent
Satoh

(10) Patent No.: US 8,050,132 B2
(45) Date of Patent: Nov. 1, 2011

(54) SEMICONDUCTOR DEVICE

(75) Inventor: Masayuki Satoh, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 186 days.

(21) Appl. No.: 12/666,251

(22) PCT Filed: Jun. 25, 2007

(86) PCT No.: PCT/JP2007/062691
§ 371 (c)(1),
(2), (4) Date: Dec. 22, 2009

(87) PCT Pub. No.: WO2009/001426
PCT Pub. Date: Dec. 31, 2008

(65) Prior Publication Data
US 2010/0188923 A1    Jul. 29, 2010

(51) Int. Cl.
*G11C 8/00* (2006.01)
(52) U.S. Cl. .............................. 365/230.05; 365/230.03
(58) Field of Classification Search ............. 365/230.05, 365/230.03, 189.04
See application file for complete search history.

(56) References Cited

U.S. PATENT DOCUMENTS

| | | | | |
|---|---|---|---|---|
| 4,888,772 A | * | 12/1989 | Tanigawa | 714/719 |
| 5,185,744 A | * | 2/1993 | Arimoto et al. | 714/719 |
| 5,818,792 A | * | 10/1998 | Sasaki et al. | 365/230.08 |
| 6,064,605 A | * | 5/2000 | Muranaka et al. | 365/190 |

FOREIGN PATENT DOCUMENTS

| | | |
|---|---|---|
| JP | 2000-49591 A | 2/2000 |
| JP | 2003-149300 A | 5/2003 |
| JP | 2003-224468 A | 8/2003 |
| WO | 00/52753 A1 | 9/2000 |

OTHER PUBLICATIONS

International Search Report (ISR) for PCT/JP2007/062691 for Examiner consideration, citing foreign reference Nos. 3-4 listed above.

* cited by examiner

*Primary Examiner* — Anh Phung
(74) *Attorney, Agent, or Firm* — Chen Yoshimura LLP

(57) ABSTRACT

A semiconductor device 110 has a plurality of memory cell blocks provided with a plurality of memory cells storing a predetermined amount of data. Each memory cell block has four or more inputs and outputs, and is internally provided with a read address decoder to the memory cell and a sense amplifier for amplifying a voltage in outputting outside. Each memory cell block is structured so as to store a truth table data for outputting a desired logic value in response to a specified address input, thereby operating as a logic circuit. The memory cell has a read word line correspondingly to the read address decoder. In the case when a voltage is applied to the read word line, the data that is held at that time is read from a read data line. The memory cell blocks are connected to each other such that the four or more outputs from one memory cell block are inputted to other four or more memory cell blocks through the sense amplifier.

10 Claims, 24 Drawing Sheets

(a)

(b)

601 Truth Table

| A0 E | A1 F | A2 | A3 Cin | D0 | D1 | D2 Cout | D3 Y |
|---|---|---|---|---|---|---|---|
| 0 | 0 | 0 | 0 | 0 | 0 | 0 | 0 |
| 1 | 0 | 0 | 0 | 0 | 0 | 0 | 1 |
| 0 | 1 | 0 | 0 | 0 | 0 | 0 | 1 |
| 1 | 1 | 0 | 0 | 0 | 0 | 1 | 0 |
| 0 | 0 | 1 | 0 | 0 | 0 | 0 | 0 |
| 1 | 0 | 1 | 0 | 0 | 0 | 0 | 1 |
| 0 | 1 | 1 | 0 | 0 | 0 | 0 | 1 |
| 1 | 1 | 1 | 0 | 0 | 0 | 1 | 0 |
| 0 | 0 | 0 | 1 | 0 | 0 | 0 | 1 |
| 1 | 0 | 0 | 1 | 0 | 0 | 1 | 0 |
| 0 | 1 | 0 | 1 | 0 | 0 | 1 | 0 |
| 1 | 1 | 0 | 1 | 0 | 0 | 1 | 1 |
| 0 | 0 | 1 | 1 | 0 | 0 | 0 | 1 |
| 1 | 0 | 1 | 1 | 0 | 0 | 1 | 0 |
| 0 | 1 | 1 | 1 | 0 | 0 | 1 | 0 |
| 1 | 1 | 1 | 1 | 0 | 0 | 1 | 1 |

(a)

(b)

701 Truth Table

| A0 | A1 Y | A2 | A3 | D0 | D1 | D2 | D3 Y |
|---|---|---|---|---|---|---|---|
| 0 | 0 | 0 | 0 | 0 | 0 | 0 | 0 |
| 1 | 0 | 0 | 0 | 0 | 0 | 0 | 0 |
| 0 | 1 | 0 | 0 | 0 | 0 | 0 | 1 |
| 1 | 1 | 0 | 0 | 0 | 0 | 0 | 1 |
| 0 | 0 | 1 | 0 | 0 | 0 | 0 | 0 |
| 1 | 0 | 1 | 0 | 0 | 0 | 0 | 0 |
| 0 | 1 | 1 | 0 | 0 | 0 | 0 | 1 |
| 1 | 1 | 1 | 0 | 0 | 0 | 0 | 1 |
| 0 | 0 | 0 | 1 | 0 | 0 | 0 | 0 |
| 1 | 0 | 0 | 1 | 0 | 0 | 0 | 0 |
| 0 | 1 | 0 | 1 | 0 | 0 | 0 | 1 |
| 1 | 1 | 0 | 1 | 0 | 0 | 0 | 1 |
| 0 | 0 | 1 | 1 | 0 | 0 | 0 | 0 |
| 1 | 0 | 1 | 1 | 0 | 0 | 0 | 0 |
| 0 | 1 | 1 | 1 | 0 | 0 | 0 | 1 |
| 1 | 1 | 1 | 1 | 0 | 0 | 0 | 1 |

(a)

(b)

801 Truth Table

| A0 C | A1 Y | A2 | A3 | D0 | D1 C | D2 | D3 Y |
|---|---|---|---|---|---|---|---|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 0 | 1 |
| 1 | 1 | 0 | 0 | 0 | 1 | 0 | 1 |
| 0 | 0 | 1 | 0 | 0 | 0 | 0 | 0 |
| 1 | 0 | 1 | 0 | 0 | 1 | 0 | 0 |
| 0 | 1 | 1 | 0 | 0 | 0 | 0 | 1 |
| 1 | 1 | 1 | 0 | 0 | 1 | 0 | 1 |
| 0 | 0 | 0 | 1 | 0 | 0 | 0 | 0 |
| 1 | 0 | 0 | 1 | 0 | 1 | 0 | 0 |
| 0 | 1 | 0 | 1 | 0 | 0 | 0 | 1 |
| 1 | 1 | 0 | 1 | 0 | 1 | 0 | 1 |
| 0 | 0 | 1 | 1 | 0 | 0 | 0 | 0 |
| 1 | 0 | 1 | 1 | 0 | 1 | 0 | 0 |
| 0 | 1 | 1 | 1 | 0 | 0 | 0 | 1 |
| 1 | 1 | 1 | 1 | 0 | 1 | 0 | 1 |

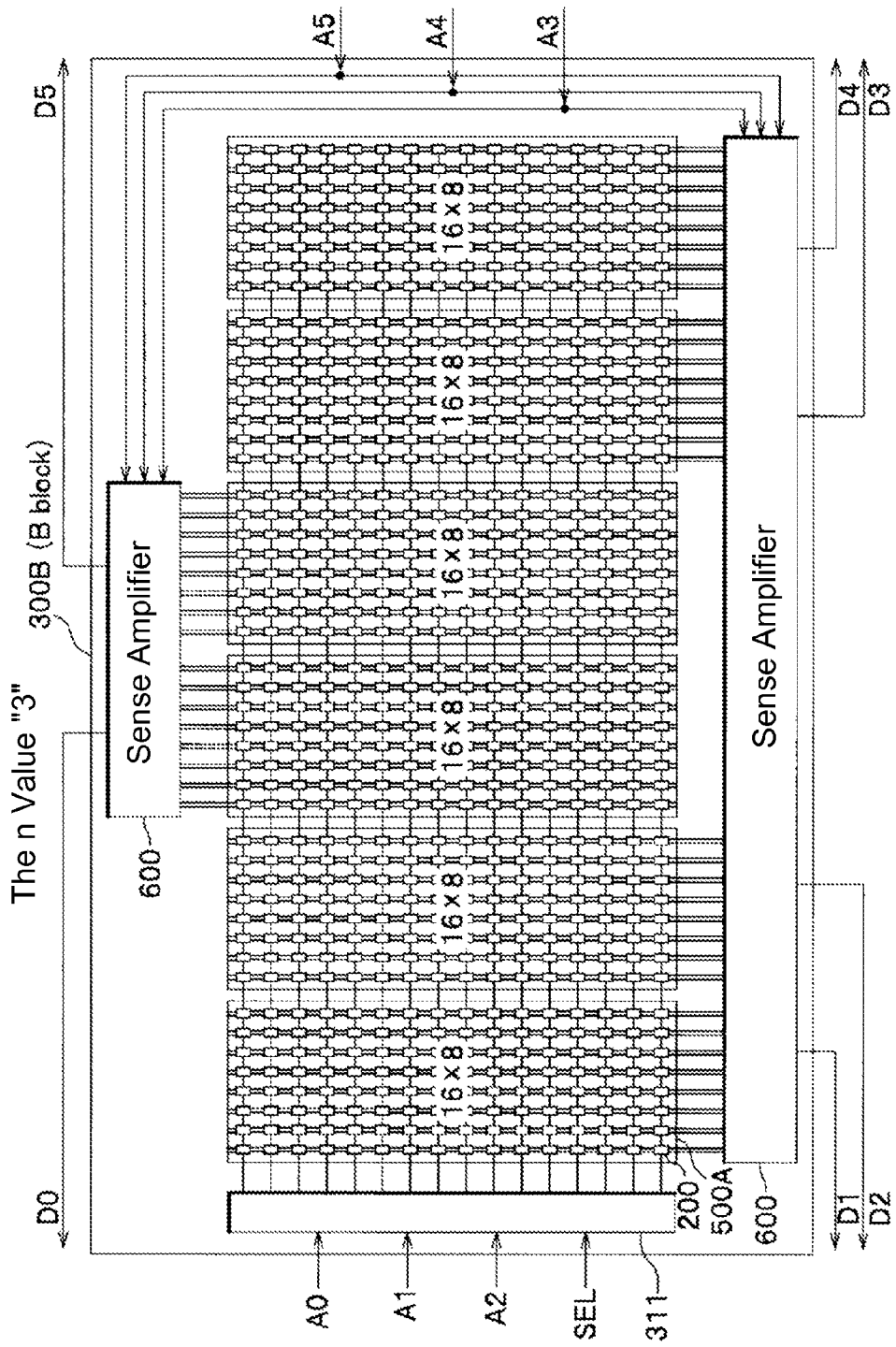

SEMICONDUCTOR DEVICE

FIELD OF THE INVENTION

The present invention relates to a semiconductor device in which a memory can operate as a logic circuit.

BACKGROUND OF THE INVENTION

Conventionally, semiconductor devices such as LSI (Large Scale Integration) have been manufactured through a number of processes, including functional design, logic circuit design, wafer manufacturing, assembly, and so forth. These manufacturing processes have been suitable for mass production of the same product, but have been unsuitable for small-lot production of various products due to the high cost.

Consequently, manufacturing technologies of semiconductor devices such as FPGA (Field Programmable Gate Array) have been developed to allow customers to use identical, mass-manufactured semiconductor devices as different products. FPGA refers to a semiconductor device such as a LSI or the like, in which a logic circuit can be programmed after manufacturing.

However, since FPGA is constructed from a variety of components, such as a logic circuit, wirings, and switches, and so forth, there has been a problem in that it requires a multilayer wiring configuration on a semiconductor process, as well as highly-sophisticated manufacturing technology.

As a solution, a new technique that allows a memory to operate as a logic circuit has been developed.

For example, Patent Reference 1 discloses a technique regarding a semiconductor device in which a plurality of memories are connected by wirings and predetermined truth values are written in the memory so as to output predetermined data in response to predetermined address input, thereby operating as a logic circuit.

Meanwhile, Patent Reference 2 discloses a technique regarding a semiconductor device in which truth table data are written in a memory, such as Static Random Access Memory (SRAM) or the like, and an address is taken as input and data as output, thereby operating as a logic circuit.

Patent Reference 1: Japanese Unexamined Patent Application Publication No. 2003-149300
Patent Reference 2: Japanese Unexamined Patent Application Publication No. 2003-224468

DISCLOSURE OF THE INVENTION

Problems to be Solved by the Invention

However, in the semiconductor device described in Patent Reference 1, there is a problem in that in order to rewrite truth values in the memory, a reconnection of wiring is required.

Furthermore, in the semiconductor device described in Patent Reference 2, there is a problem in that memory cell blocks, each of which is an aggregation of a plurality of memory cells that stores a predetermined amount of data, are arranged in an arrayed manner, and therefore the data from a single memory cell block are output only to two of the four adjacent memory cell blocks (e.g. right and bottom ones among the top, bottom, left, and right ones). This has made it difficult to operate as logic circuits that require data feedback (requiring the data to return to the original memory cell block).

Accordingly, the present invention has been made in consideration of the above-mentioned problems and therefore aims to provide a semiconductor device, which is a memory that operates as a logic circuit in which truth values in the memory can be rewritten without reconnecting wirings and data can be fed back.

Means to Solve the Problems

To solve the above-mentioned problems, the present invention provides a semiconductor device which has a plurality of memory cell blocks each of which contains a plurality of memory cells for storing a predetermined amount of data. Each memory cell block has four or more inputs and outputs and is internally provided with a read address decoder for the memory cells and also with a sense amplifier for amplifying a voltage for output operation to an exterior. It is formed to store truth table data in the memory cells for outputting a desired logic value in response to a specified address input so that it operates as a logic circuit. The memory cell has a read word line correspondingly to the read address decoder. When a voltage is applied to the read word line, the data that is held at that time is read from a read data line. The memory cell blocks are connected to each other in such a manner that the four or more outputs from one memory cell block are inputted to other four or more memory cell blocks through the sense amplifier.

Advantageous Effect of the Invention

According to the present invention, there can be provided a semiconductor device, which is a memory that operates as a logic circuit in which truth values in the memory can be rewritten without reconnecting wirings and data can be fed back.

BRIEF DESCRIPTION OF THE DRAWINGS

FIG. 11B is a diagram that illustrates a configuration example of a memory cell block when the n value is 3.

DESCRIPTION OF THE NUMERALS

Figure 1:
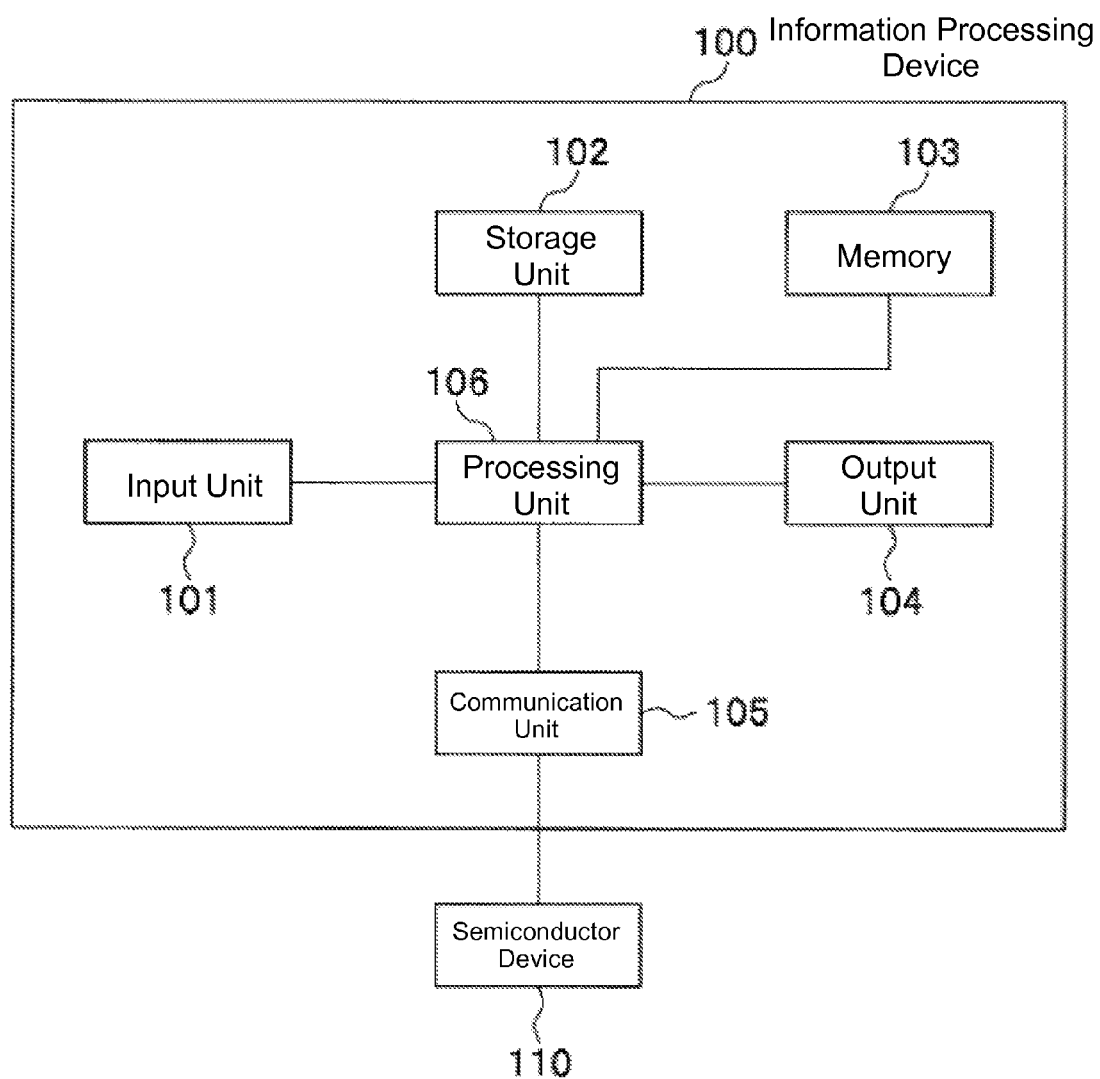
FIG. 1 is a configuration diagram of a semiconductor device and an information processing device.

100 Information processing device
110 Semiconductor device
200 Memory cell
201, 202 Read word line
211 Write word line
221, 222 Read data line
231, 232 Write data line
300 Memory cell block
301 Select line
311 Read address decoder
401 Write-read circuit
601, 701, 801 Truth table
1400 Large-scale memory
1900 Tester

DESCRIPTION OF THE PREFERRED EMBODIMENTS

The following is a description of a semiconductor device according to embodiments of the present invention presented with reference to the drawings.

FIG. 1 is a configuration diagram of a semiconductor device and an information processing device. An information processing device 100 is a computer device and is equipped with an input unit 101 such as a keyboard and so forth, a storage unit 102 such as a hard disk or the like, a memory 103 such as RAM (Random Access memory) and so forth, an output unit 104 such as CRT (Cathode Ray Tube) and so forth, a communication unit 105 which is a communication device, and a processing unit 106 such as CPU (Central Processing Unit) and the like.

Note that bit data (described later in the step S1204 in FIG. 18) to be created by the information processing device 100 may be held in ROM (Read Only Memory), which is not shown in the drawing.

A semiconductor device 110 is connected to the communication unit 105 of the information processing device 100. As hardware, the semiconductor device 110 is a storage device similar to, for example, standard SRAM (Static Random Access Memory). Details will be explained in FIG. 2 and thereafter.

Figure 2:
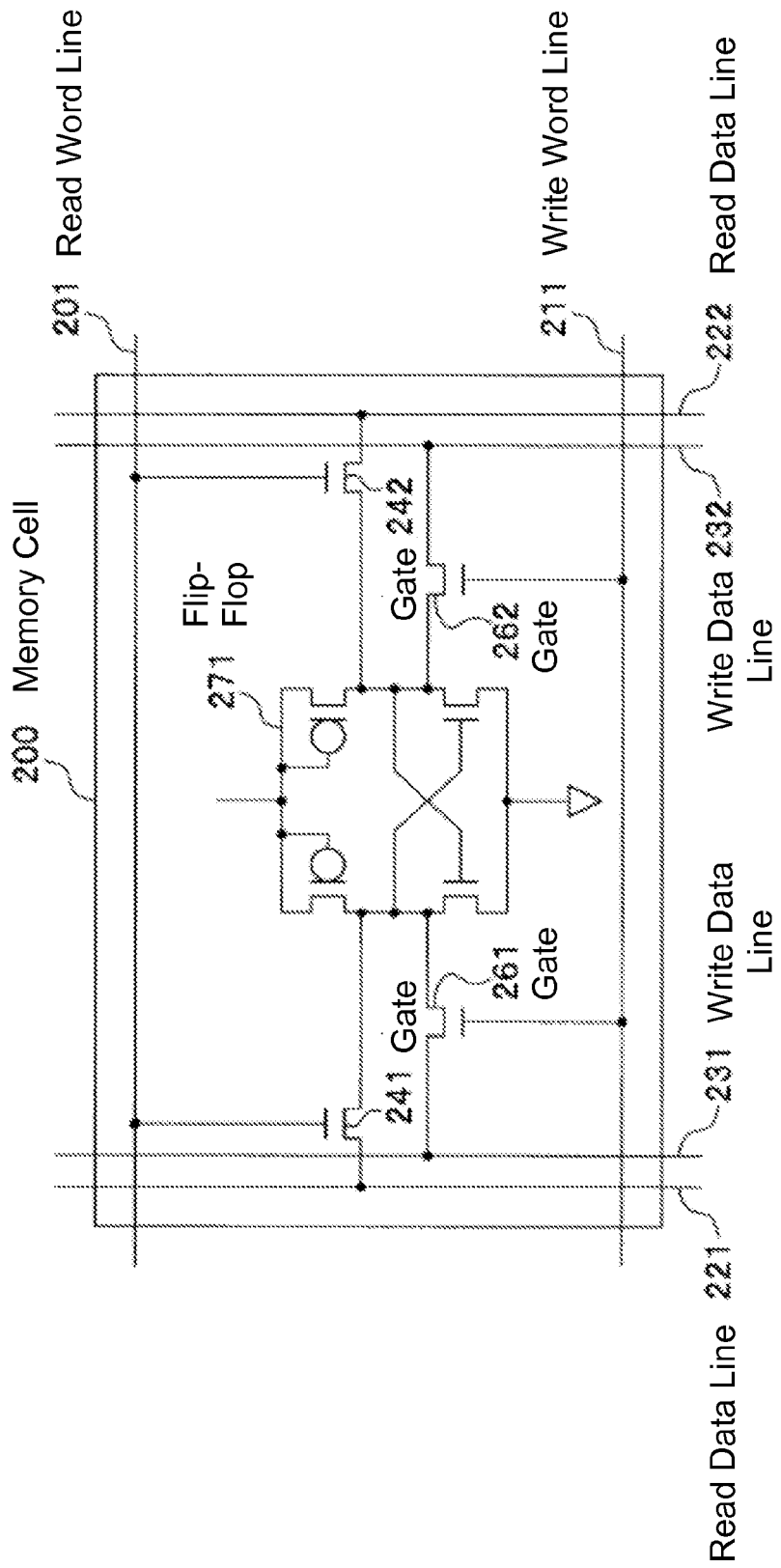
FIG. 2 is a configuration diagram of a memory cell which is a storage element that makes up the semiconductor device shown in FIG. 1.

FIG. 2 is a configuration diagram of a memory cell, which is a storage element that makes up the semiconductor device 110 shown in FIG. 1. A composition of a memory cell 200 includes a read word line 201, a write word line 211, read data lines 221 and 222, write data lines 231 and 232, gates 241, 242, 261, and 262, and a flip-flop 271.

While the gates 241, 242, 261, and 262 are to be constructed from N-MOS (Negative-Metal Oxide Semiconductor), the gates may be constructed from P-MOS (Positive-Metal Oxide Semiconductor) instead. Furthermore, the gates may also be constructed from a combination of N-MOS and P-MOS. To accommodate such cases, peripheral circuits are to be modified appropriately.

The read word line 201 is a wiring to which a voltage is applied when data in the memory cell 200 are read out from outside. When the voltage is applied to the read word line 201, the gates 241 and 242 open consequently.

The write word line 211 is a wiring to which a voltage is applied when data from outside are written in the memory cell 200. When the voltage is applied to the write word line 211, the gates 261 and 262 open consequently.

The read data lines 221 and 222 are wirings via which data held in the flip-flop 271 are read out when the predetermined voltage is applied to the read word line 201 and the gates 241 and 242 open consequently. Note that when data "0" is read out from the read data line 221, data "1" is read out from the read data line 222, and when data "1" is read out from the read data line 221, data "1" is read out from the read data line 222, thereby performing a so-called differential signal operation.

The write data lines 231 and 232 are wirings via which data are written in the flip-flop 271 when the voltage is applied to the write word line 211 and the gates 261 and 262 open consequently. When data "0" is written from the write data line 231, data "1" is written from the write data line 232, and when data "1" is written from the write data line 231, data "0" is written from the write data line 232.

The flip-flop 271 is a storage circuit that holds data "0" or "1," which are stored in the memory cell 200 in the above-described manner.

Figure 3:
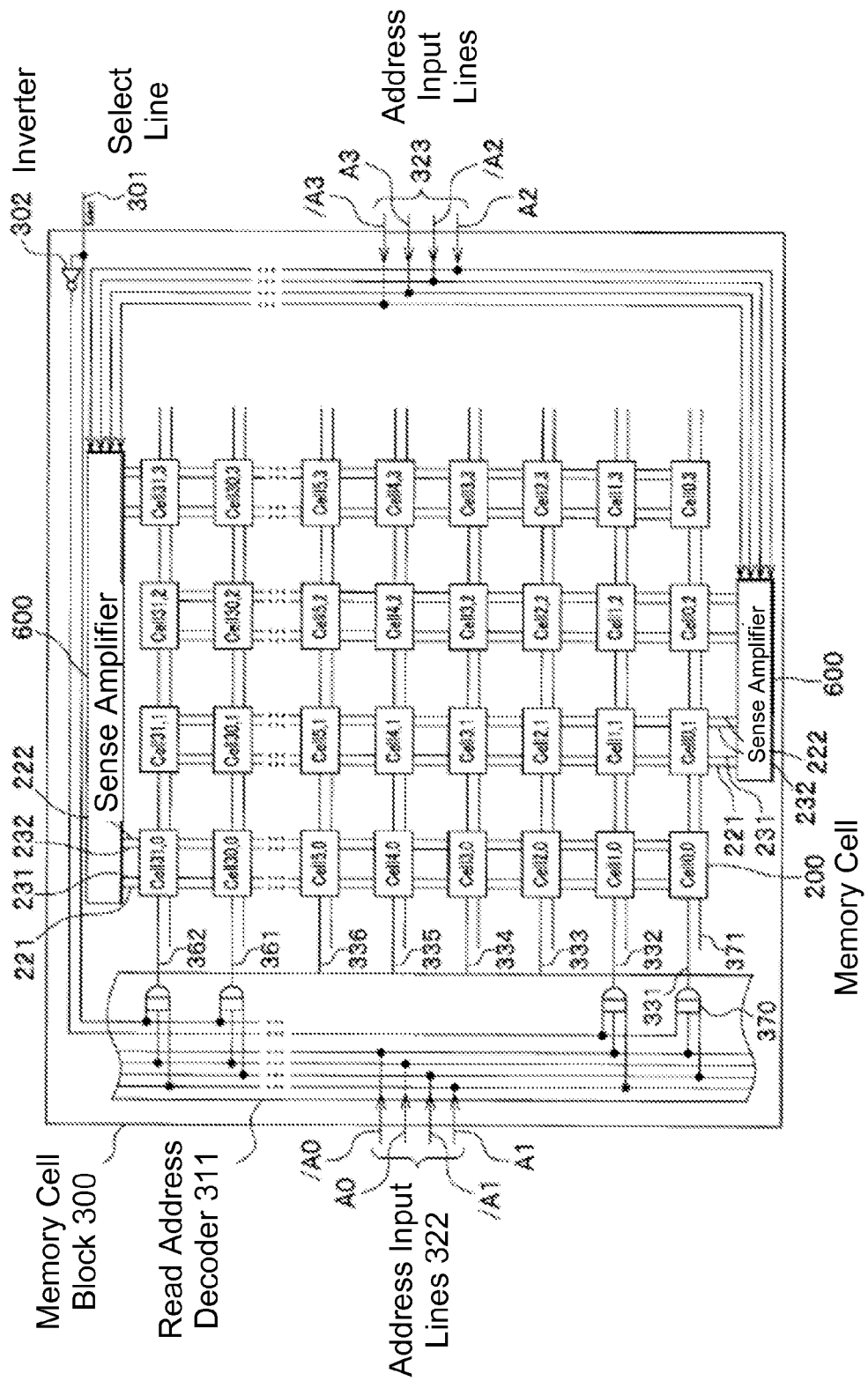
FIG. 3 is a configuration diagram of a memory cell block.

FIG. 3 is a configuration diagram of a memory cell block that is part of the internal structure of the semiconductor device 110 shown in FIG. 1 (see also FIG. 2).

The memory cell block 300 is constructed of a plurality of memory cells 200 arranged and connected in an arrayed manner, a read address decoder 311, and two sense amplifiers 600. The sense amplifier 600 is a circuit via which a small voltage output from the memory cell 200 is amplified, thereby stabilizing a current flowing between the memory cell blocks 300. The sense amplifier 600 also plays a role of a read address decoder regarding the y address (address in the lateral direction).

The read address decoder 311 receives a plurality of address differential signals (A0 and /A0, A1 and /A1) from address input lines 322.

In the appended claims, "4" inputs and outputs means "4 pairs" in the case of differential signals and "4 lines" in the cases other than differential signals (in the case of a single wiring). This also applies to other numbers of inputs and outputs.

The memory cell block 300 is structured such that the read data lines 221 and 222 are connected to other memory cell blocks 300 (not shown in the drawing) via the sense amplifier 600 on the upper side of the outer memory cells 200 on the highest row, that is, on the upper side of the memory cell 200

(Cell31, 0) and the memory cell 200 (Cell31, 3), and also on the lower side of the inner memory cells 200 on the lowest row, that is, on the lower side of the memory cell 200 (Cell0, 1) and the memory cell 200 (Cell0, 2). In addition, y address differential signals (A2 and /A2, A3 and /A3) are input to the sense amplifiers 600 from the address input lines 323.

In the memory cell block 300, the read data line 221 and 222 are disconnected on the upper side of the inner memory cells 200 on the highest row, that is, on the upper side of the memory cell 200 (Cell31, 1) and the memory cell 200 (Cell31, 2), and also on the lower side of the outer memory cells 200 on the lowest row, that is, on the lower side of the memory cell 200 (Cell0, 0) and the memory cell 200 (Cell0, 3).

That is, in the memory cell block 300, read data lines are configured so that outer multiple pairs thereof output upwardly via the sense amplifier 600, while inner multiple pairs thereof output downwardly via the sense amplifier 600. This way, the scale of output (readout) of the memory cell block 300 can be kept at the minimum required level, the load of various data processing can be alleviated, and multiple outputs can be performed in multiple directions.

In the memory cell block 300, inputs from the address input lines 322 and 323 and from an select line (particular address select line) 301 (SEL) make it possible to read out information stored in a particular memory cell 200.

The select line 301 is equipped with an inverter 302. In addition, the read address decoder 311 is equipped with a plurality of logic circuits 370 (such as AND circuits and NAND circuits). In addition, write word lines 371 (corresponding to the write word line 211 in FIG. 2) are connected to the write address decoder 411 (see FIG. 5).

As shown in FIG. 3, for example, it is designed so that when "1" is inputted from the select line 301, the upper half of the memory cells 200 in the memory cell block 300 operate, and when "0" is input from the select line 301, the lower half of the memory cells 200 in the memory cell block 300 operate.

Therefore, for example, if the upper half of the memory cells 200 in the memory cell block 300 are set to operate as an adder and if the lower half of the memory cells 200 in the memory cell block are set to operate as a subtractor, instantaneous witching between the adder and subtractor is possible by simply switching the signal from the select line 301. This applies not only to switching between the adder and subtractor, but also to switching between a multiplier and divider. Additionally, in the same manner, switching between an adder and a normal storage device is also possible.

Note that the signals inputted to the memory cell block 300 and the signals outputted from the memory cell block 300 may be either a differential signal or a single signal.

Figure 4:
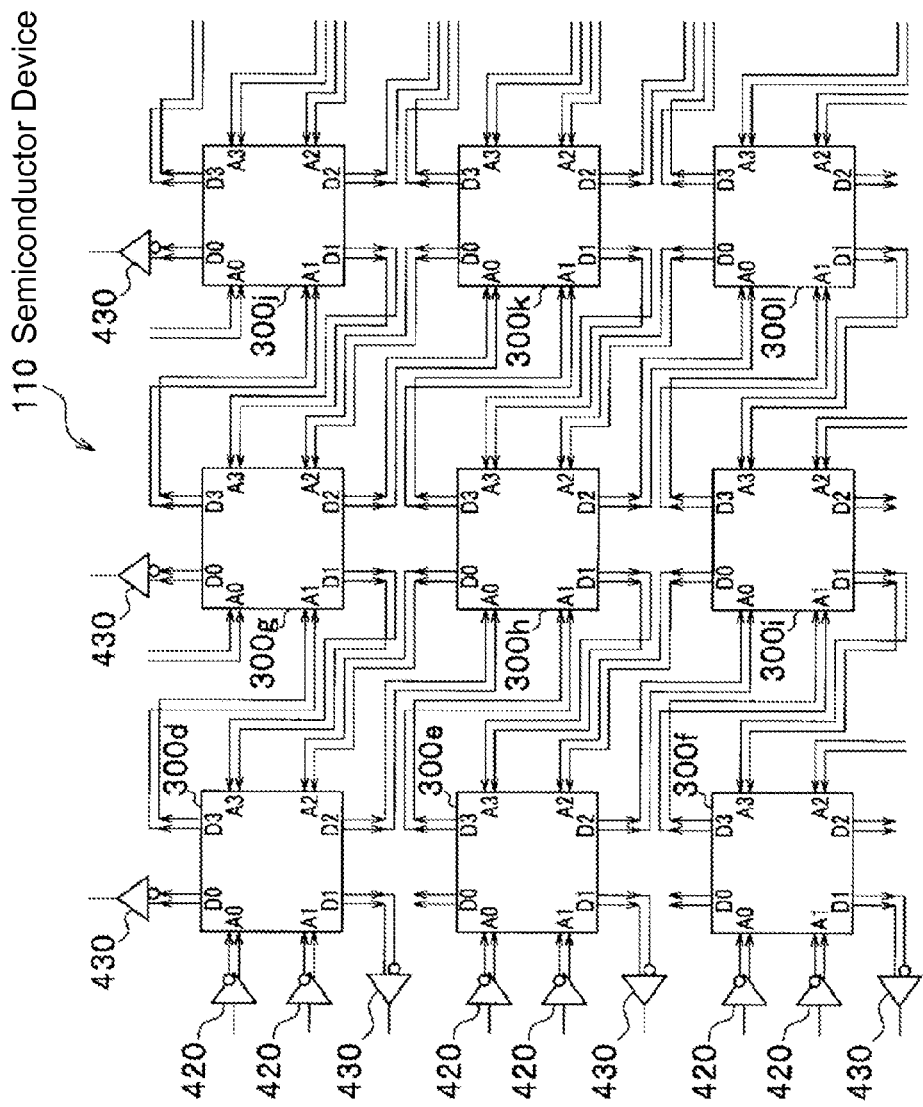
FIG. 4 is a diagram that illustrates a connection condition of a read port in a semiconductor device.

FIG. 4 is a diagram that illustrates a connection condition of a read port (two outputs of the read data lines each for the upper and lower sides and two inputs each from the address input lines 322 and 323 shown in FIG. 3) in the semiconductor device 110 (see FIG. 1). FIG. 4 also represents a part of an upper-left section of a planar view of the semiconductor device 110.

In the memory cell blocks 300d through 300l, an input A0 (hereinafter referred to as "A0"; the same applies to A1 through A3) indicates a combination of A0 and /A0 shown in FIG. 3 for purpose of simplifying the description. The same also applies to A1 through A3.

In the memory cell blocks 300d through 300l, an output D0 (hereinafter referred to as "D0"; the same applies to D1 through D3) indicates a combination of two read data lines of the memory cell 200 (Cell31, 0) shown in FIG. 3 for purpose of simplifying the description. The same also applies to D1 through D3.

A0 through A3 and D0 through D3 in the memory cell block 300d through 300l are connected as shown in FIG. 4.

Note that a driver circuit 420 is to convert a signal which is inputted from an external device to the present device (the semiconductor device 110) into differential signals. Additionally, an amplifier 430 is to amplify and convert inputted differential signals to a regular signal and output it to an external device.

The wirings described above enable the semiconductor device 110 to readily perform a data feedback. Specifically, for example, when data are sent from D3 of the memory cell block 300d to A1 of the memory cell block 300g, the data can be fed back to A3 of the memory cell block 300d by writing a truth table in the memory cell block 300g such that data inputted from A1 of the memory cell block 300g are outputted to D1 of the memory cell block 300g.

Furthermore, it is also possible to have the semiconductor device 110 operate as various types of logic circuits simply by changing the truth tables written in the memory cell blocks 300d through 300l without changing the wirings.

Note that the frequency and degree of bends of the above-described wirings are not limited to those shown in FIG. 4, but can be modified appropriately.

Figure 5:
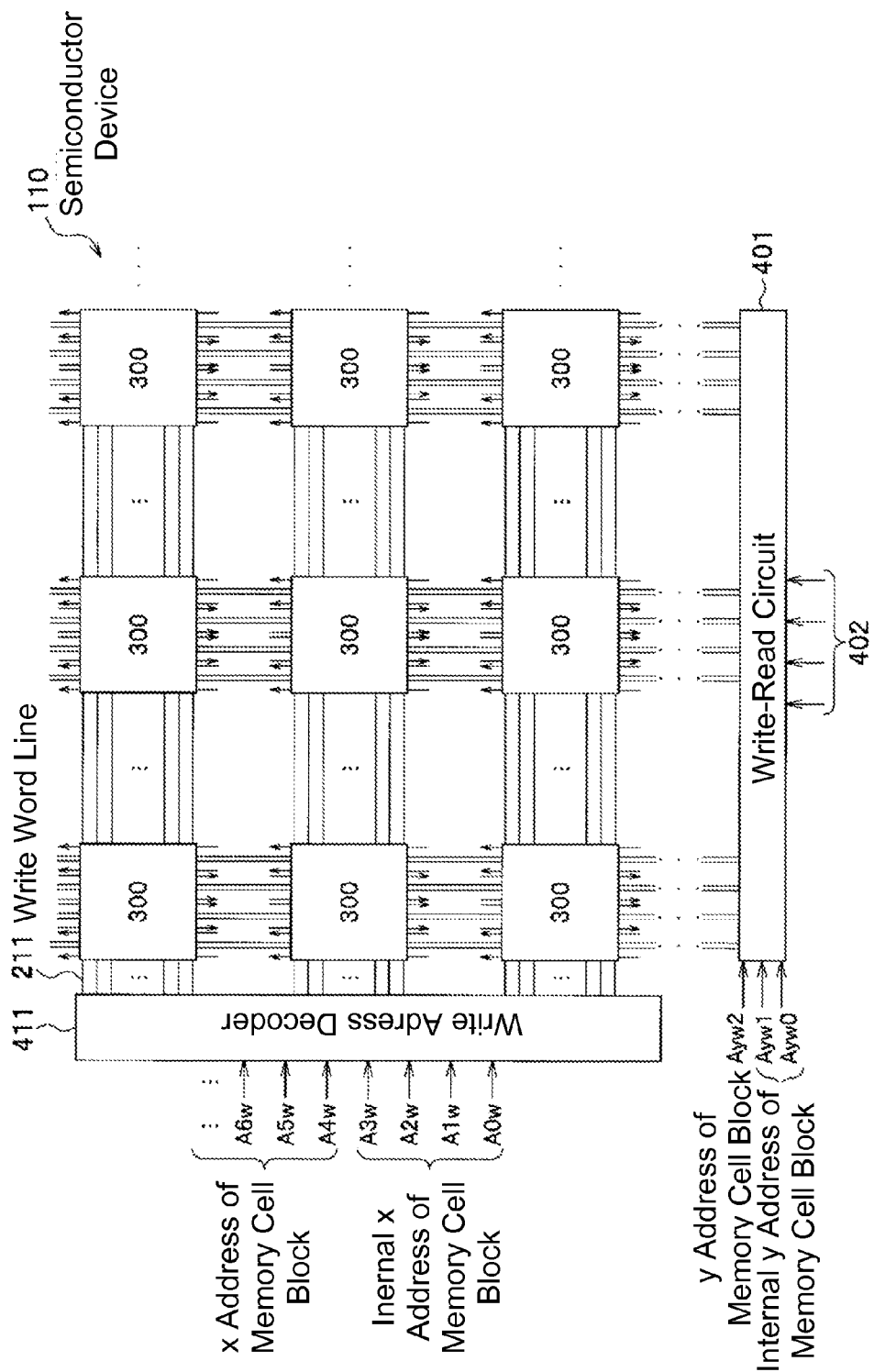
FIG. 5 is an internal structure diagram of a semiconductor device.

FIG. 5 is an internal structure diagram of the semiconductor device 110 (see FIG. 1). Each memory cell block 300 is arranged in an arrayed manner, a write address decoder 411 is placed on the left side, and a write-read circuit 401 is placed on the bottom side, all of which are connected in a manner shown in the drawing. Stated another way, FIG. 5 is a diagram that illustrates a configuration other than the connection condition of the read ports of the same semiconductor device 110 as described in FIG. 4

The write address decoder 411 is a device that specifies an x address (vertical address of the semiconductor device 110 shown in FIG. 5) of the memory cell block 300 when writing data in the memory cell block 300.

To the write address decoder 411, an x address for identifying a particular memory cell block 300 among a plurality of the memory cell blocks 300 is inputted through upper addresses (in this case, A4w and thereafter such as A5w, A6w, and so on), and an x address for identifying an inner portion (a memory cell 200) within the identified memory cell block 300 is inputted from lower addresses (in this case, A0w through A3w).

Further, the write-read circuit 401 is a device that specifies a y address of the memory cell block 300 from and to which data are read and written. The write-read circuit 401 also reads data from and writes data onto the specified memory cell block 300.

Specifically, to the write-read circuit 401, a y address (horizontal address of the semiconductor device 110 shown in FIG. 5), which is for specifying a particular memory cell block 300 among a plurality of memory cell blocks 300, is inputted (in this case, to Ayw2), and then a y address for specifying an inner portion (memory cell 200) within the identified memory cell block 300 is inputted (in this case, to Ayw0 and Ayw1). Furthermore, to the write-read circuit 401, multiple-bit (in this case, 4-bit) data are inputted from inputs 402.

As described above, particular memory cells 200 in a particular memory cell block 300 can appropriately be selected to perform rewrite of truth table data, etc.

Namely, when truth table data stored in memory cells 200 in some of a plurality of memory cell blocks 300 are rewritten, the semiconductor device 110 can change its operation according to the rewritten truth table data.

Next, an example of a case of using the semiconductor device 110 (see FIG. 4) as a 3-bit adder will be explained with reference to FIG. 6 through FIG. 9.

Figure 6:
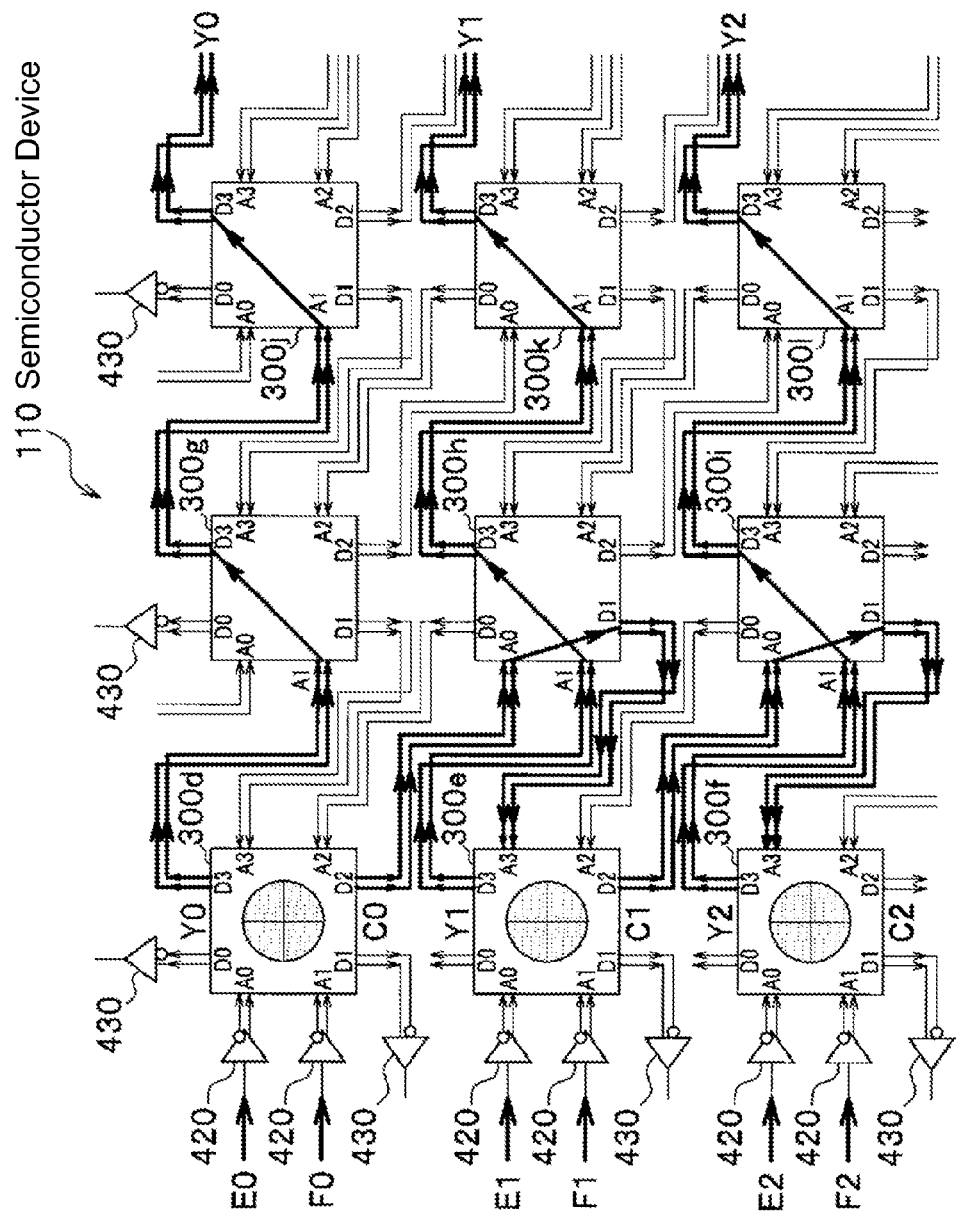
FIG. 6 is a configuration example of a 3-bit adder.

FIG. 6 is a configuration example of a 3-bit adder. Connections between memory cell blocks in FIG. 6 are the same as those shown in FIG. 4.

Here, a case in which two 3-bit numbers E and F are added and a result Y is obtained is explained. The least significant bit of E is referred to as E0, the next bit as E1, and the most significant bit as E2. Likewise, the least significant bit of F is referred to as F0, the next bit as F1, and the most significant bit as F2. Additionally, the least significant bit of Y is referred to as Y0, the next bit as Y1, and the most significant bit as Y2. Furthermore, a carry resulting from an addition of the least significant bits is referred to as C0, a carry from an addition of the next bits as C1, and a carry from an addition of the most significant bits as C2. Note also that each signal is differential, but is described in a simplified manner for convenience of description.

In the memory cell block 300d, E0 is inputted to A0 and F0 is inputted to A1, and after an addition is performed, Y0 is outputted from D3 and C0 is outputted from D2.

In the memory cell block 300e, E1 is inputted to A0, F1 is inputted to A1, and C0 is inputted to A3, and after an addition is performed, Y1 is outputted from D3 and C1 is outputted from D2.

In the memory cell block 300f, E2 is inputted to A0, F2 is inputted to A1, and C1 is inputted to A3, and after an addition is performed, Y2 is outputted from D3 and C2 is outputted from D2.

Y0, which has been outputted from D3 in the memory cell block 300d, is then outputted from D3 in the memory cell block 300j via a route (shown in bold line) as indicated in the drawing.

Y1, which has been outputted from D3 in the memory cell block 300e, is then outputted from D3 in the memory cell block 300k via a route (shown in bold line) as indicated in the drawing.

Y2, which has been outputted from D3 in the memory cell block 300f, is then outputted from D3 in the memory cell block 300l via a route (shown in bold line) as indicated in the drawing.

This way, the result of additions, that is, Y0, Y1, and Y2, can be obtained.

Figure 7:
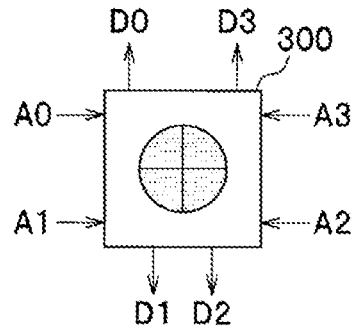
FIG. 7($a$) is a simplified diagram of a memory cell block 300 and FIG. 7($b$) is a truth table to be stored in memory cell blocks 300$d$, 300$e$, and 300$f$.

In FIG. 7, (a) is a simplified diagram of a memory cell block 300, and (b) is a truth table to be stored in the memory cell blocks 300d, 300e, and 300f (see FIG. 6 as necessary).

As indicated in FIG. 7(a), when inputs are made to A0 through A3 in the memory cell block 300, data defined by the truth table are output from D0 through D3 in response to the inputs.

As shown in FIG. 7(b), when inputs of E (E0 through E2), F (F0 through F2), and Cin (C0 through C2) are made to A0, A1, and A2, a bit value as a result of addition of these three inputs is outputted to D3 as Y (Y0 through Y2) and a carry thereof is outputted to D2 as Cout (C0 through C2).

Note that because D0 and D1 are not used here, "0" is set to be outputted from D0 and D1 in all cases.

Note also that truth values other than A2 are set at the same values between the first through fourth top rows and the fifth through eighth rows, respectively. This is to ensure that accurate output results are obtained even when either data of "0" or "1" is inputted to A2. The same applies to the ninth through twelfth rows versus the thirteenth through sixteenth rows.

Figure 8:
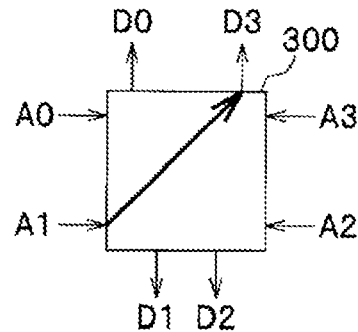
FIG. 8($a$) is a simplified diagram of the memory cell block 300 and FIG. 8($b$) is a truth table to be stored in memory cell blocks 300$g$, 300$j$, 300$k$, and 300$l$.

In FIG. 8, (a) is a simplified diagram of a memory cell block 300, and (b) is a truth table to be stored in the memory cell blocks 300g, 300j, 300k, and 300l (see FIG. 6 as necessary).

As indicated in FIG. 8(a), when inputs are made to A0 through A3 in the memory cell block 300, data defined by the truth table are output from D0 through D3 in response to the inputs.

As indicated in FIG. 8(b), when Y (Y0 through Y2) is input to A1, the value thereof is outputted to D3 without a change.

Note that because D0 through D2 are not used here, "0" is set to be outputted from D0 through D2 in all cases.

Also, while only two types (two rows) of truth table, namely, "0"→"0" and "1"→"1" from A1 to D3, are needed in reality, the provided truth table is composed of sixteen rows so as to ensure that accurate output results are obtained even when either data of "0" or "1" is inputted to A0, A2, and A3.

Figure 9:
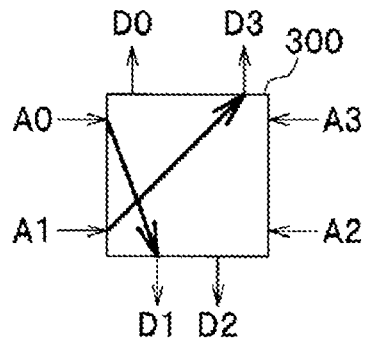
FIG. 9($a$) is a simplified diagram of the memory cell block 300 and FIG. 9($b$) is a truth table to be stored in memory cell blocks 300$h$ and 300$i$.

In FIG. 9, (a) is a simplified diagram of a memory cell block 300, and (b) is a truth table to be stored in the memory cell blocks 300h and 300i (see FIG. 6 as necessary).

As indicated in FIG. 9(a), when inputs are made to A0 through A3 in a memory cell block 300, data defined by the truth table are outputted from D0 through D3 in response to the inputs.

As indicated in FIG. 9(b), when C (C0 through C2) is inputted to A0, the value thereof is outputted to D1 without a change. Likewise, when Y (Y0 through Y2) is inputted to A1, the value thereof is outputted to D3 without a change.

Note that because D0 and D2 are not used here, "0" is set to be outputted from D0 and D2 in all cases.

Also, in the same manner as FIG. 8(b), a truth table is provided so as to ensure that accurate output results are obtained even when either data of "0" or "1" is inputted to A2 and A3.

In this way, the semiconductor device 110 can be used as an adder. Similarly, it can be used as a subtractor, multiplier, or divider.

Next, a configuration example of the semiconductor device 110 of the present embodiment is explained with reference to FIG. 10A through FIG. 14B (see other drawings as necessary). Hereinafter, a value obtained by dividing the number of outputs from a memory cell block 300 by 2 is referred to as "n value." Stated another way, the n value indicates the average number of outputs from the respective top and bottom sides of a memory cell block 300.

Figure 10A:
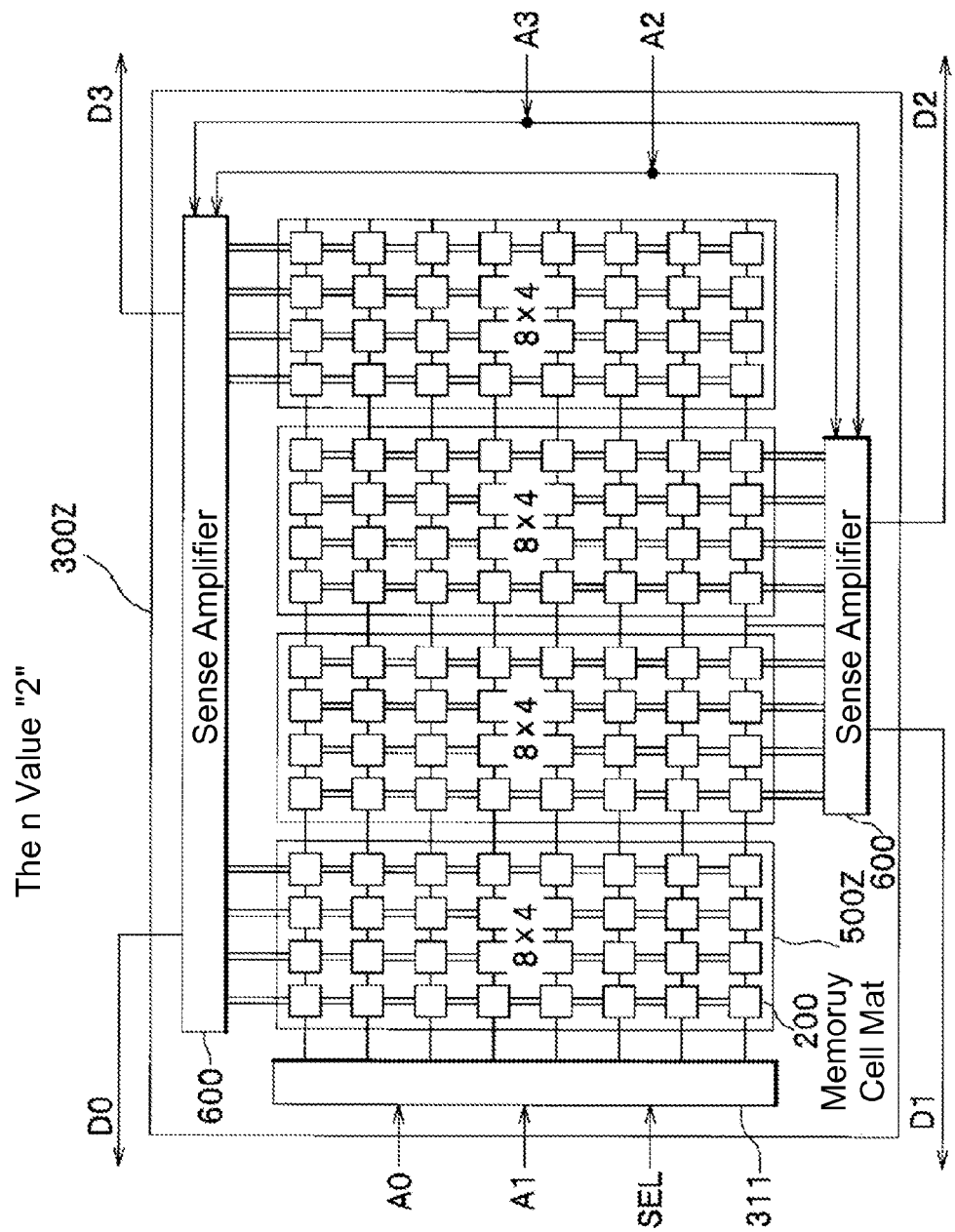
FIG. 10A is a diagram that illustrates a configuration example of a memory cell block when the n value is 2.

FIG. 10A is a diagram that illustrates a configuration example of a memory cell block when the n value is "2." A memory cell block 300Z is constructed of a read address decoder 311, two sense amplifiers 600, and four memory cell mats 500Z. A memory cell mat 500Z is composed of 32 (8×4) memory cells 200. The memory cell block 300Z receives two inputs each from the left and right sides, respectively, and performs two outputs each from the top and bottom sides, respectively.

Figure 10B:
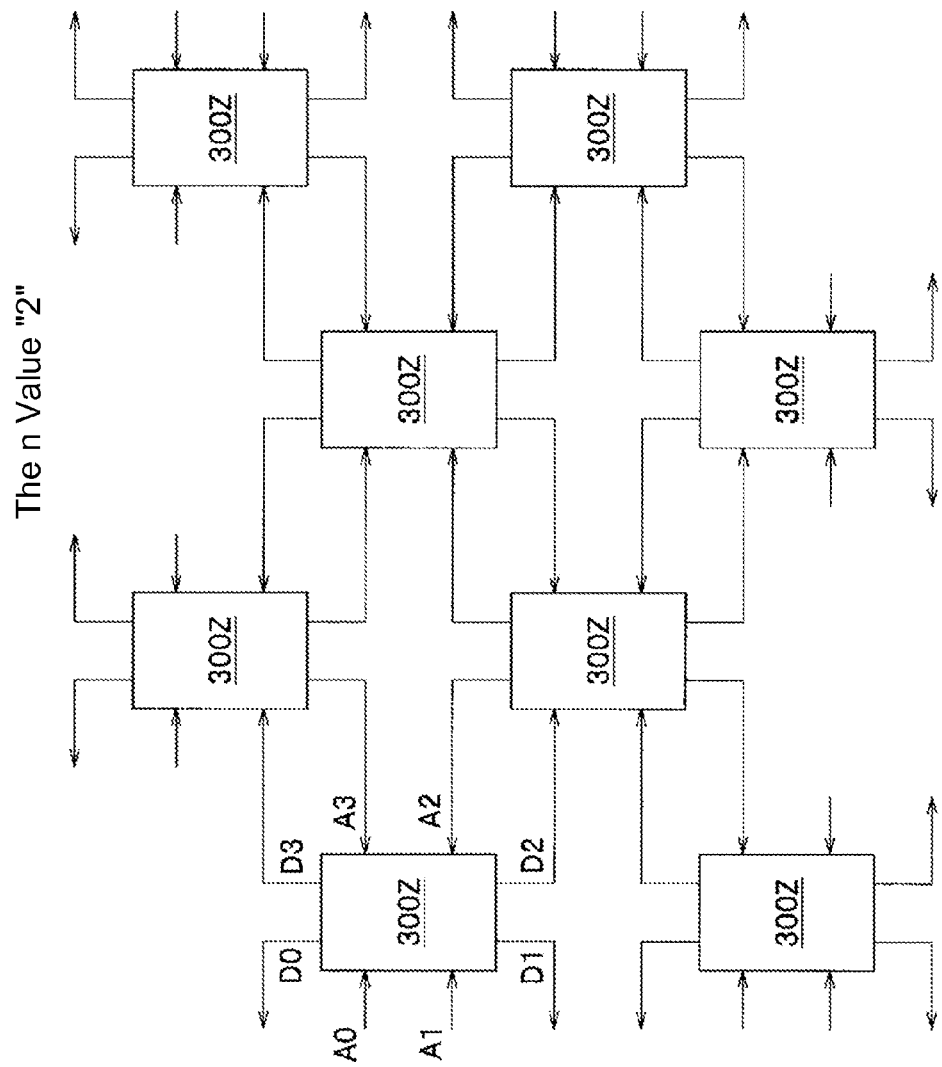
FIG. 10B is a diagram that illustrates a configuration example of the semiconductor device 110 when the n value is 2.

FIG. 10B is a diagram that illustrates a configuration example of the semiconductor device 110 when the n value is "2." By interconnecting the memory cell blocks 300Z in this way, each memory cell block 300Z can perform four outputs in response to four inputs.

Figure 11A:
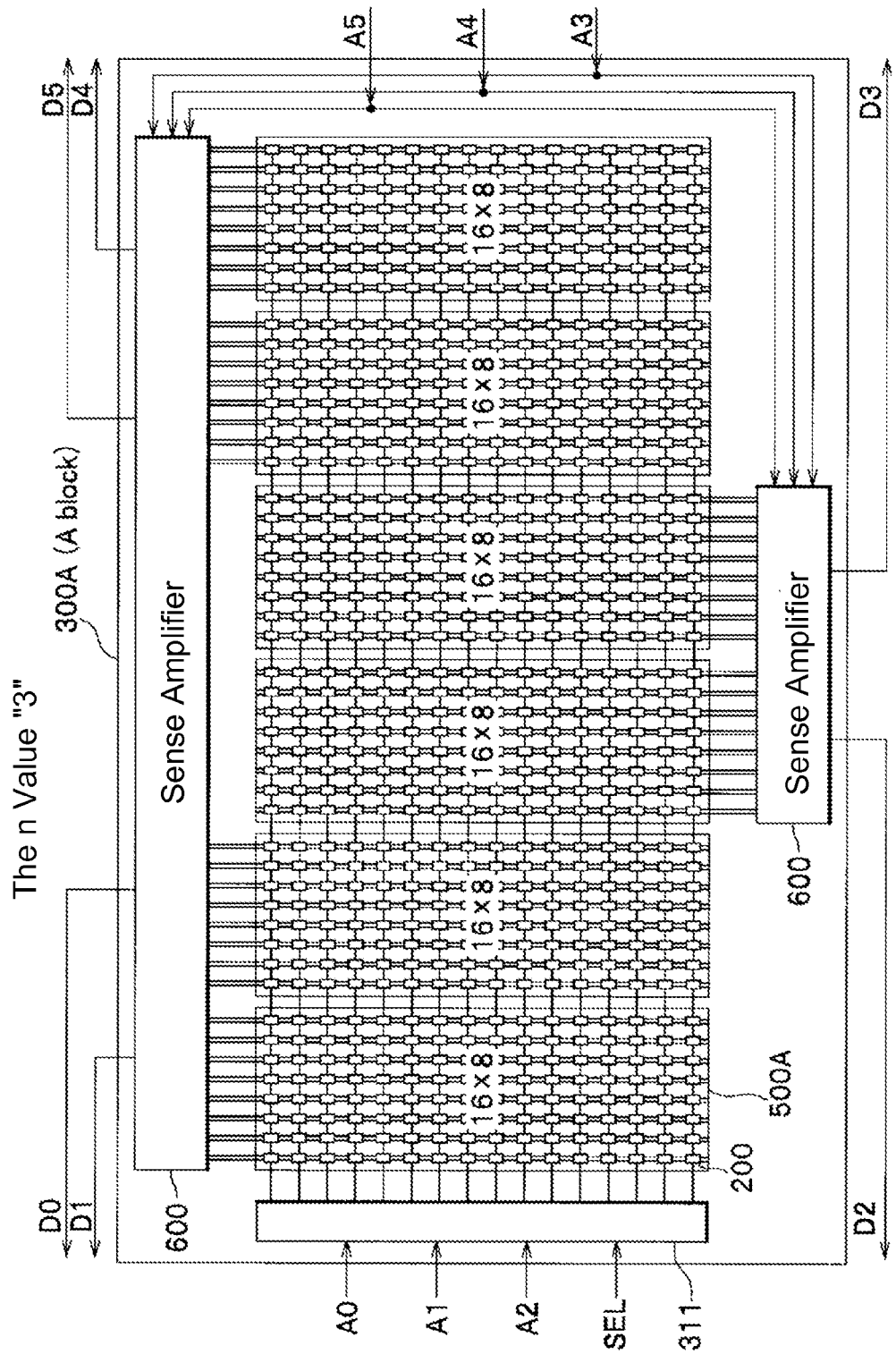
FIG. 11A is a diagram that illustrates a configuration example of a memory cell block when the n value is 3.

FIG. 11A is a diagram that illustrates a configuration example of one of the pair of memory cell blocks when the n value is "3." A cell block 300A is constructed of a read address decoder 311, two sense amplifiers 600, and six memory cell mats 500A. A memory cell mat 500A is composed of 128 (16×8) memory cells 200. The memory cell block 300A receives three inputs each from the left and right sides, respectively, and performs four outputs from the top side and two outputs from the bottom side.

FIG. 11B is a diagram that illustrates a configuration example of the other one of the pair of memory cell blocks when the n value is "3." A memory cell block 300B is constructed of a read address decoder 311, two sense amplifiers 600, and six memory cell mats 500A. The memory cell block 300B receives three inputs each from the left and right sides, respectively, and performs two outputs from the top side and four outputs from the bottom side.

Figure 11C:
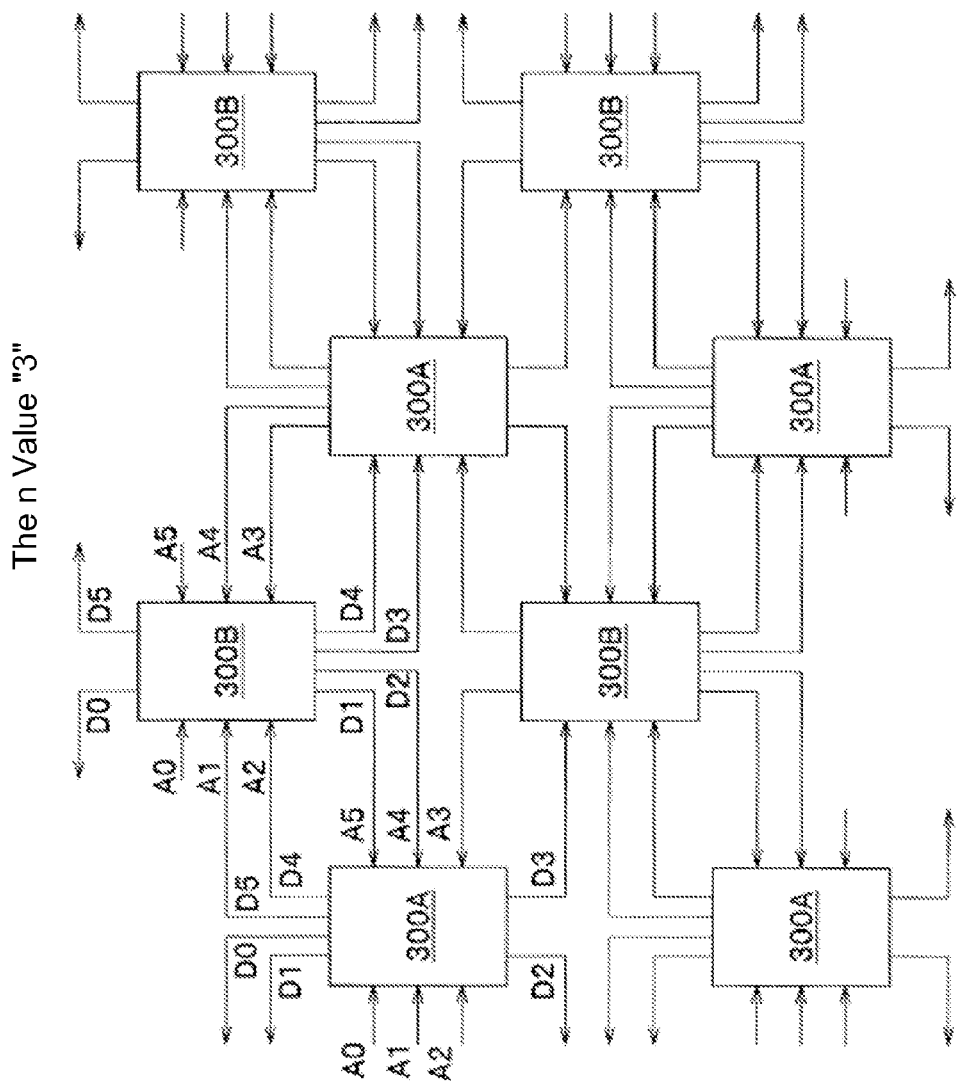
FIG. 11C is a diagram that illustrates a configuration example of the semiconductor device 110 when the n value is 3.

FIG. 11C is a diagram that illustrates a configuration example of the semiconductor device 110 when the n value is "3." By interconnecting the memory cell blocks 300A and 300B this way, each of the memory cell blocks 300A and 300B can perform six outputs in response to six inputs.

Figure 12A:
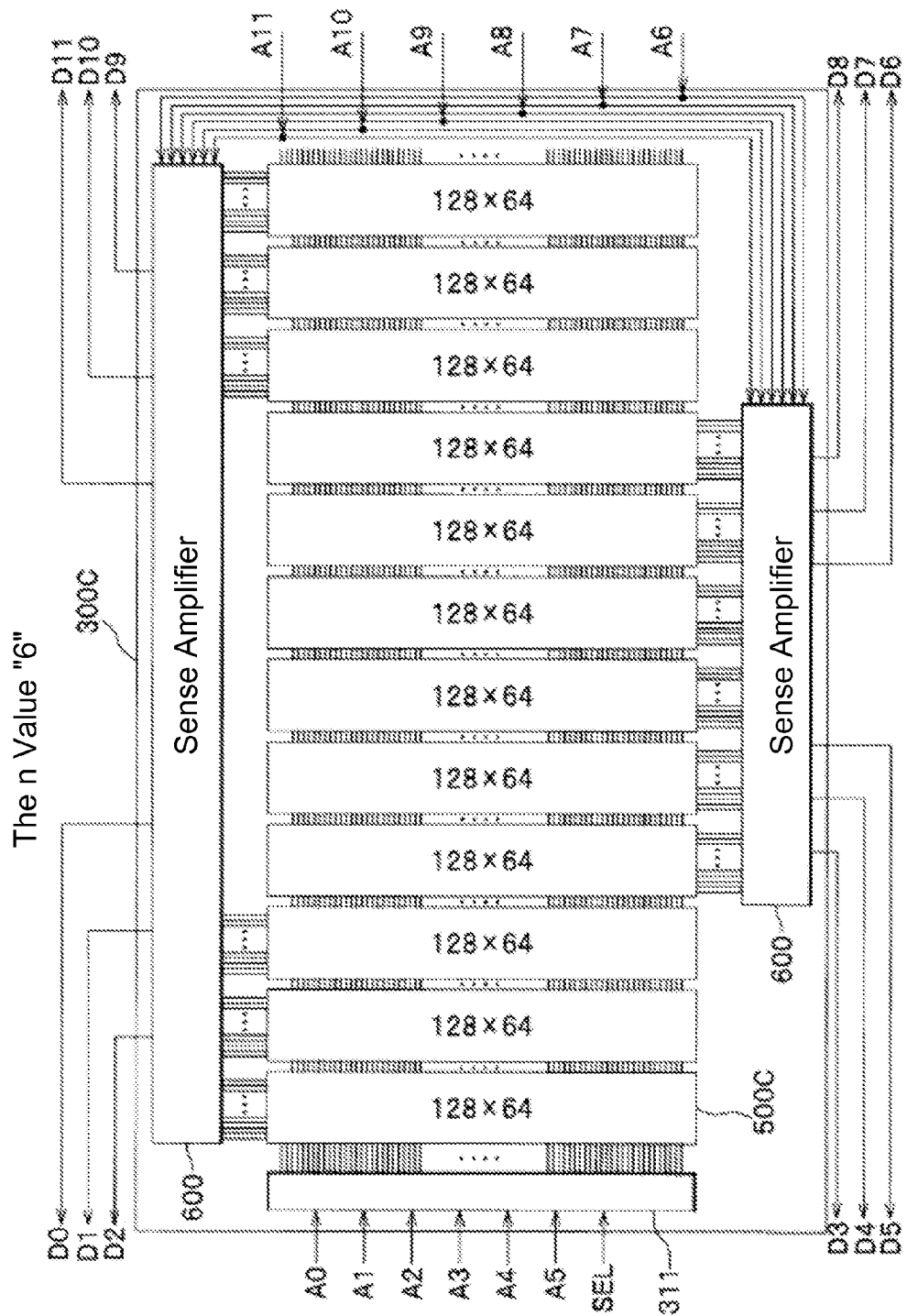
FIG. 12A is a diagram that illustrates a configuration example of a memory cell block when the n value is 6.

FIG. 12A is a diagram that illustrates a configuration example of a memory cell block when the n value is "6." A memory cell block 300C is constructed of a read address decoder 311, two sense amplifiers 600, and twelve memory cell mats 500C. A memory cell mat 500C is composed of 8192 (128×64) memory cells 200. The memory cell block 300C receives six inputs each from the left and right sides, respectively, and performs six outputs each from the top and bottom sides, respectively.

Figure 12B:
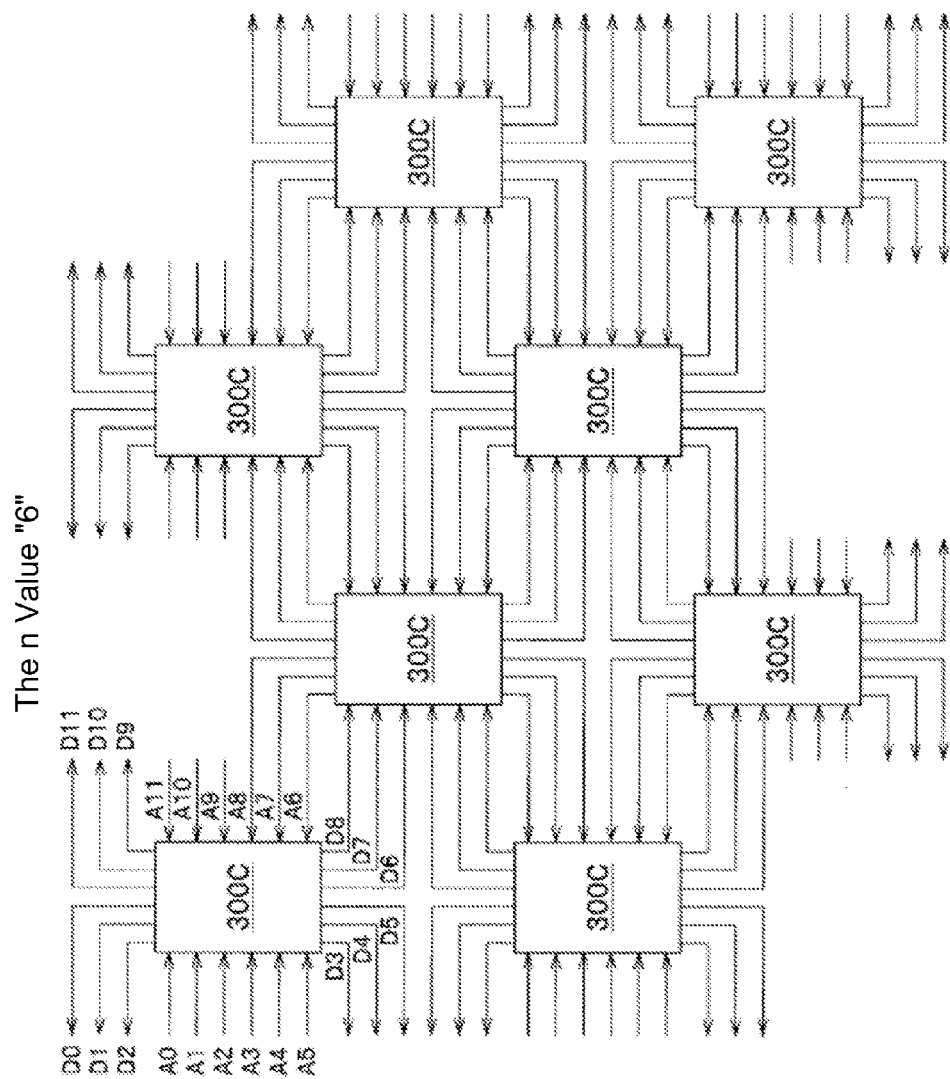
FIG. 12B is a diagram that illustrates a configuration example of the semiconductor device 110 when the n value is 6.

FIG. 12B is a diagram that illustrates a configuration example of the semiconductor device 110 when the n value is "6." By interconnecting memory cell blocks 300C this way, each memory cell block 300C can perform twelve outputs in response to twelve inputs.

Figure 13A:
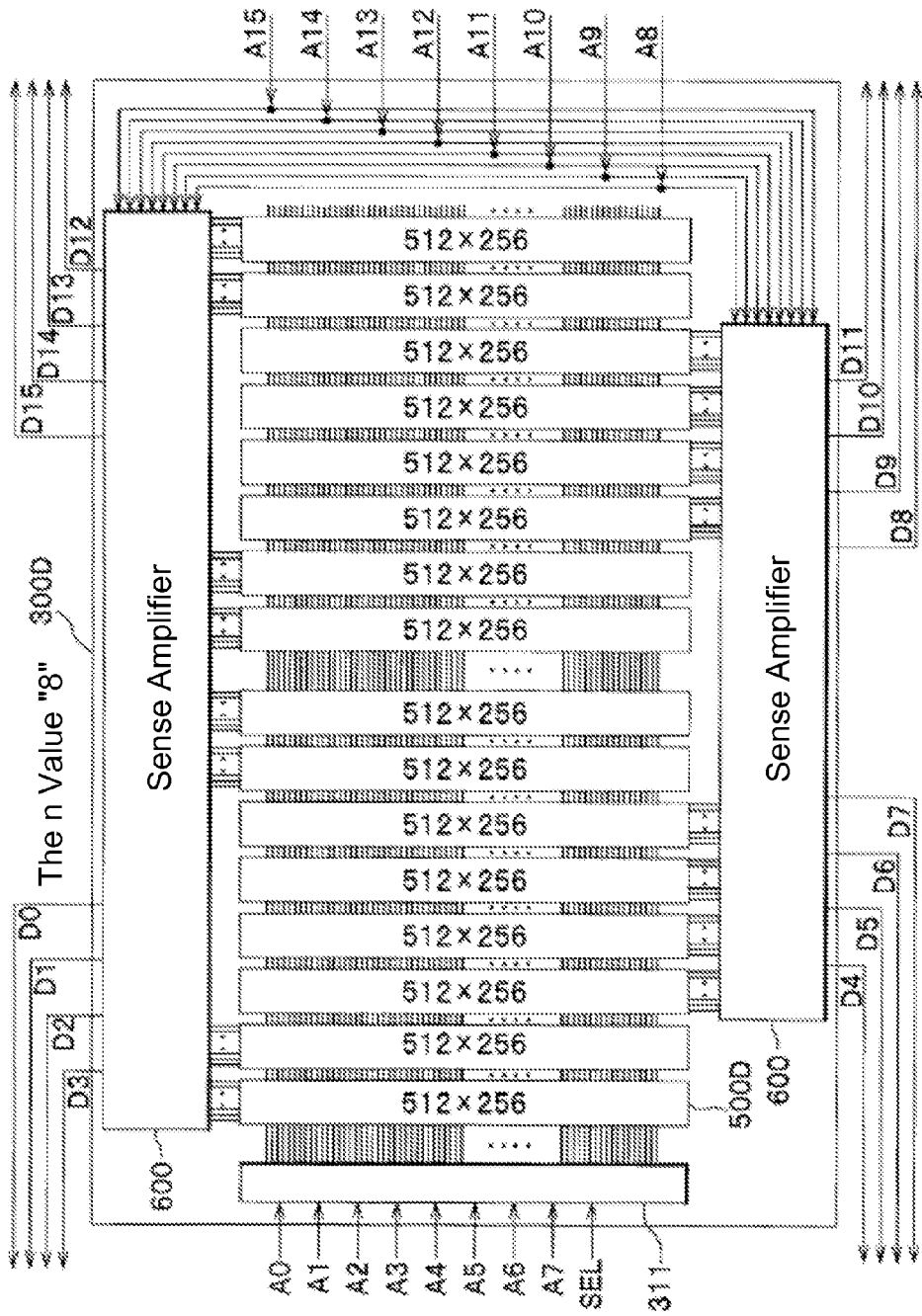
FIG. 13A is a diagram that illustrates a configuration example of a memory cell block when the n value is 8.

FIG. 13A is a diagram that illustrates a configuration example of a memory cell block when the n value is "8." A memory cell block 300D is constructed of a read address decoder 311, two sense amplifiers 600, and 16 memory cell mats 500D. A memory cell mat 500D is composed of 131072 (512×256) memory cells 200. The memory cell block 300D receives eight inputs each from the left and right sides, respectively, and performs eight outputs each from the top and bottom sides, respectively.

Figure 13B:
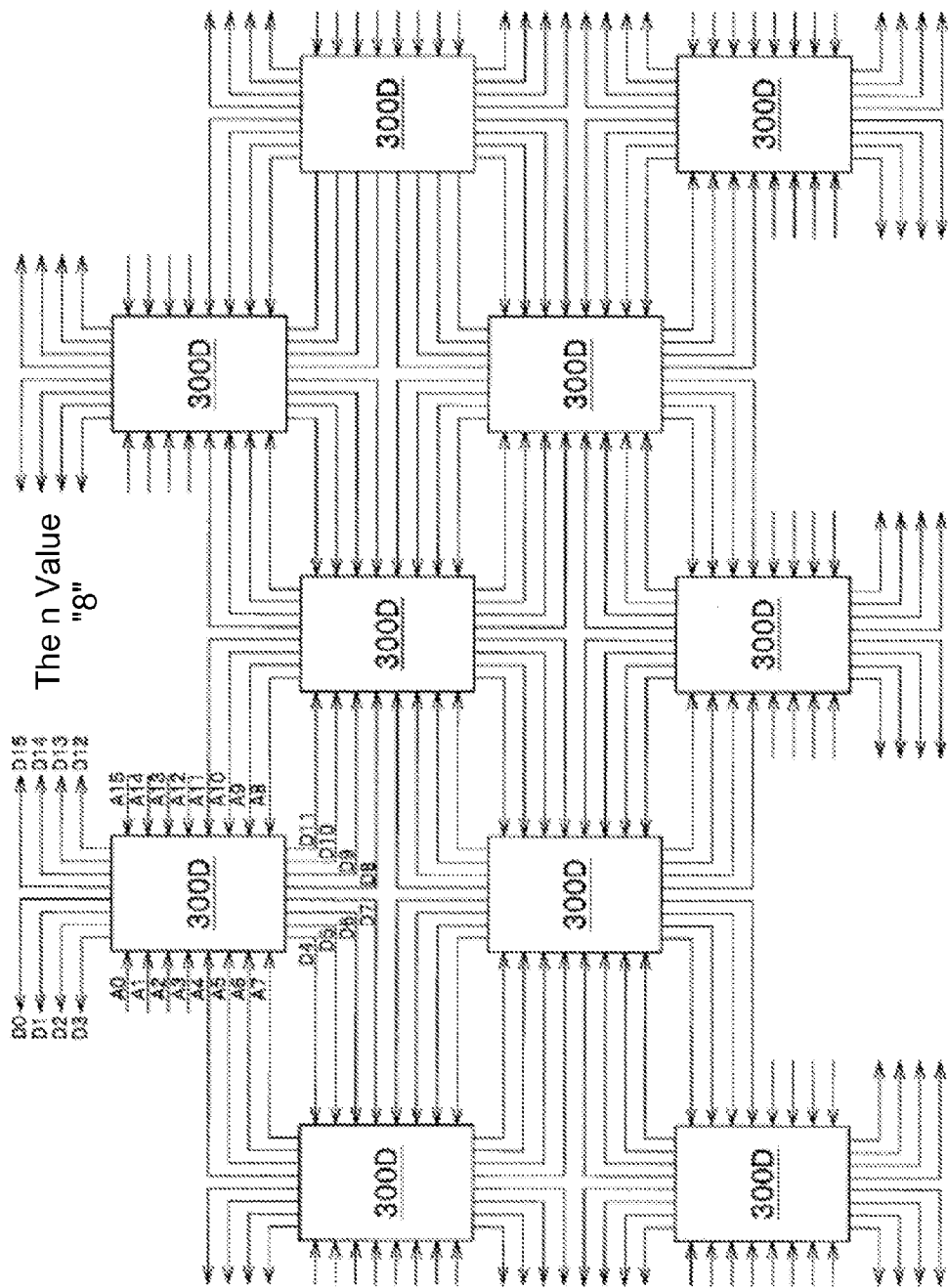
FIG. 13B is a diagram that illustrates a configuration example of the semiconductor device 110 when the n value is 8.

FIG. 13B is a diagram that illustrates a configuration example of the semiconductor device 110 when the n value is "8." By interconnecting memory cell blocks 300D this way, each memory cell block 300D can perform sixteen outputs in response to sixteen inputs.

Figure 14A:
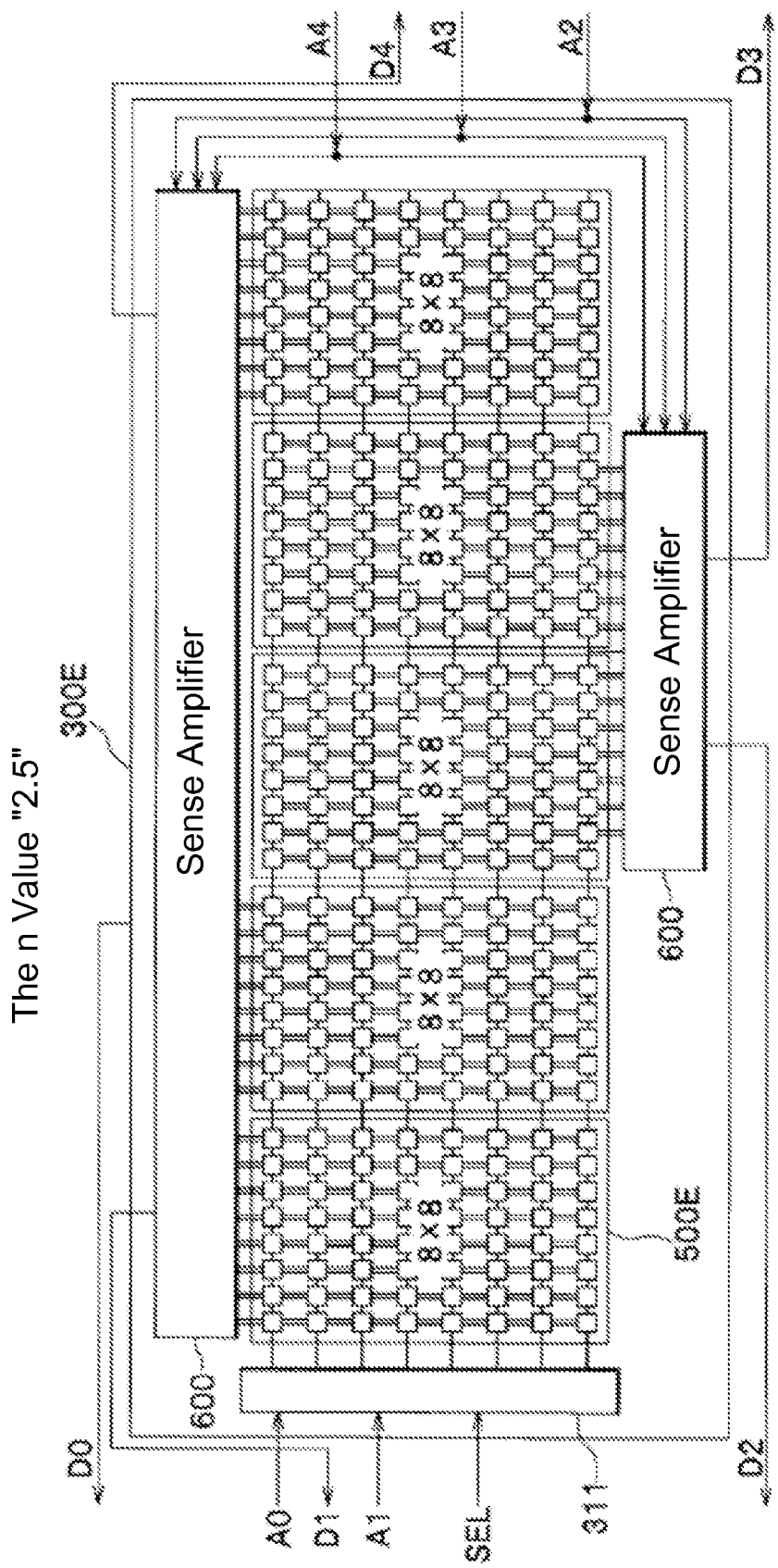
FIG. 14A is a diagram that illustrates a configuration example of a memory cell block when the n value is 2.5.

FIG. 14A is a diagram that illustrates a configuration example of a memory cell block when the n value is "2.5." A memory cell block 300E is constructed of a read address decoder 311, two sense amplifiers 600, and five memory cell mats 500E. A memory cell mat 500E is composed of 64 (8×8) memory cells 200. The memory cell block 300E receives two inputs from the left side and three inputs from the right side and performs three outputs from the top side and two outputs from the bottom side.

Figure 14B:
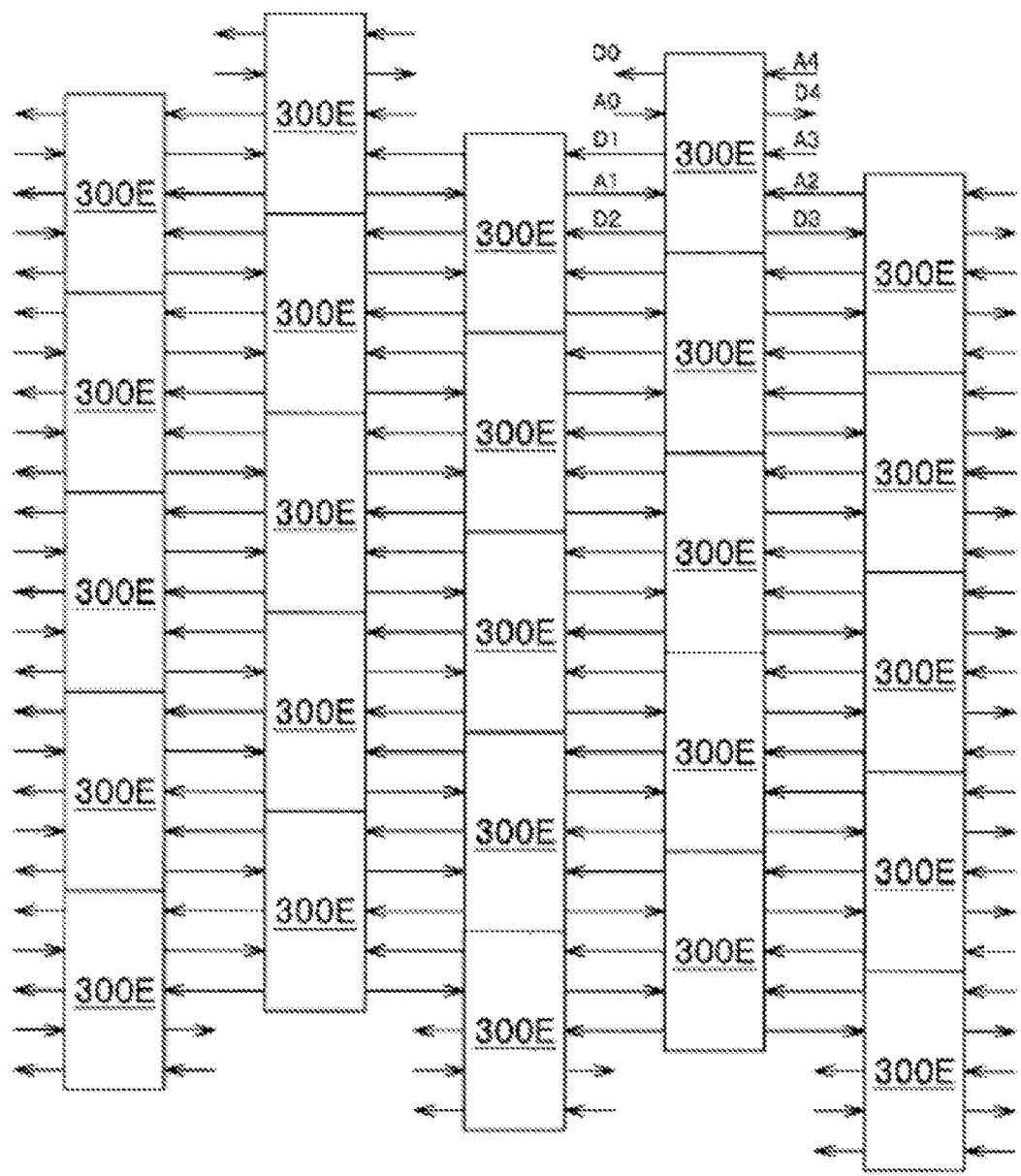
FIG. 14B is a diagram that illustrates a configuration example of the semiconductor device 110 when the n value is 2.5.

FIG. 14B is a diagram that illustrates a configuration example of the semiconductor device 110 when the n value is "2.5." By interconnecting memory cell blocks 300E this way, each memory cell block 300E can perform five outputs in response to five inputs.

Figure 15:
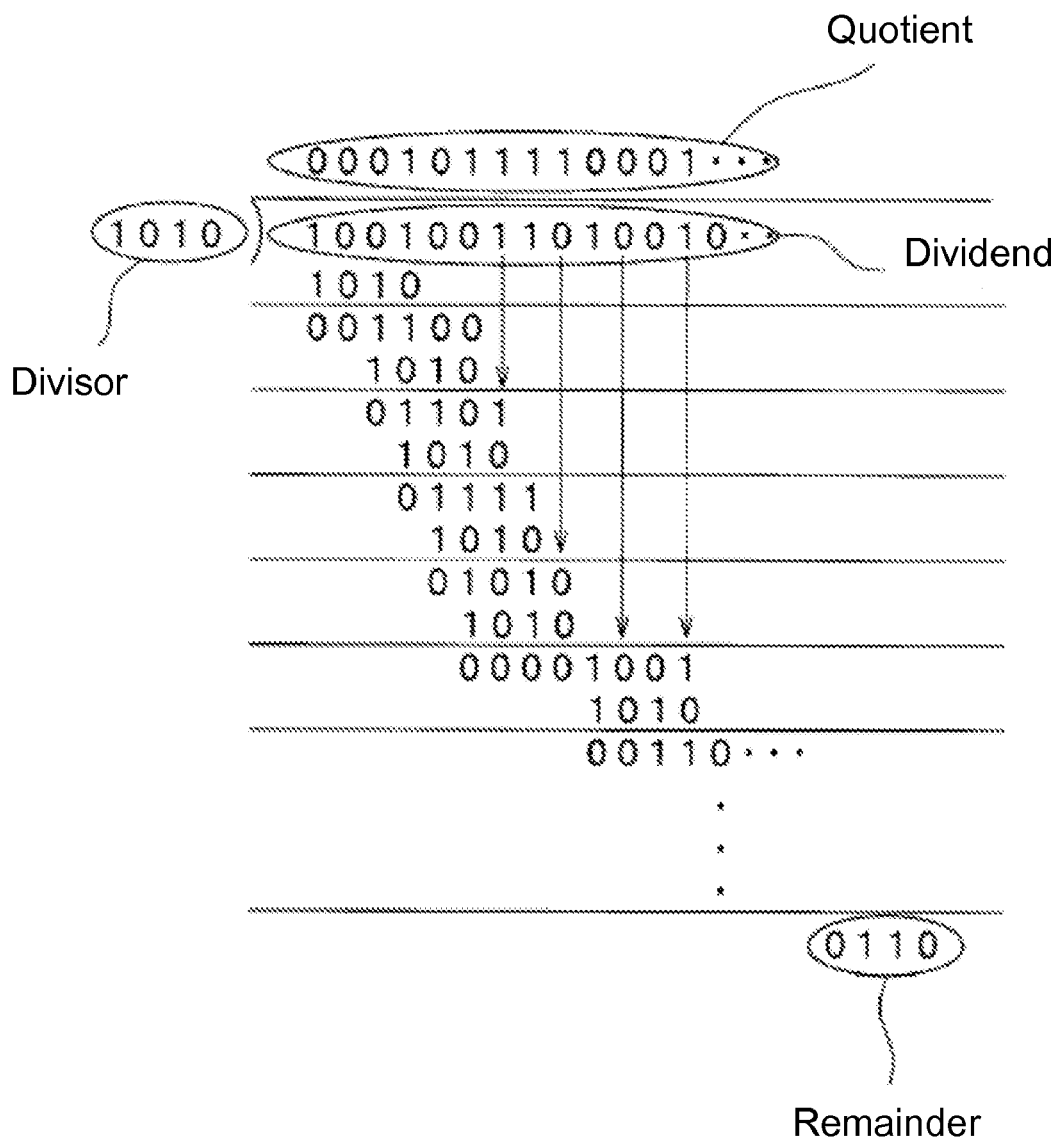
FIG. 15 is a diagram that illustrates an example of algebraic division.
Figure 16:
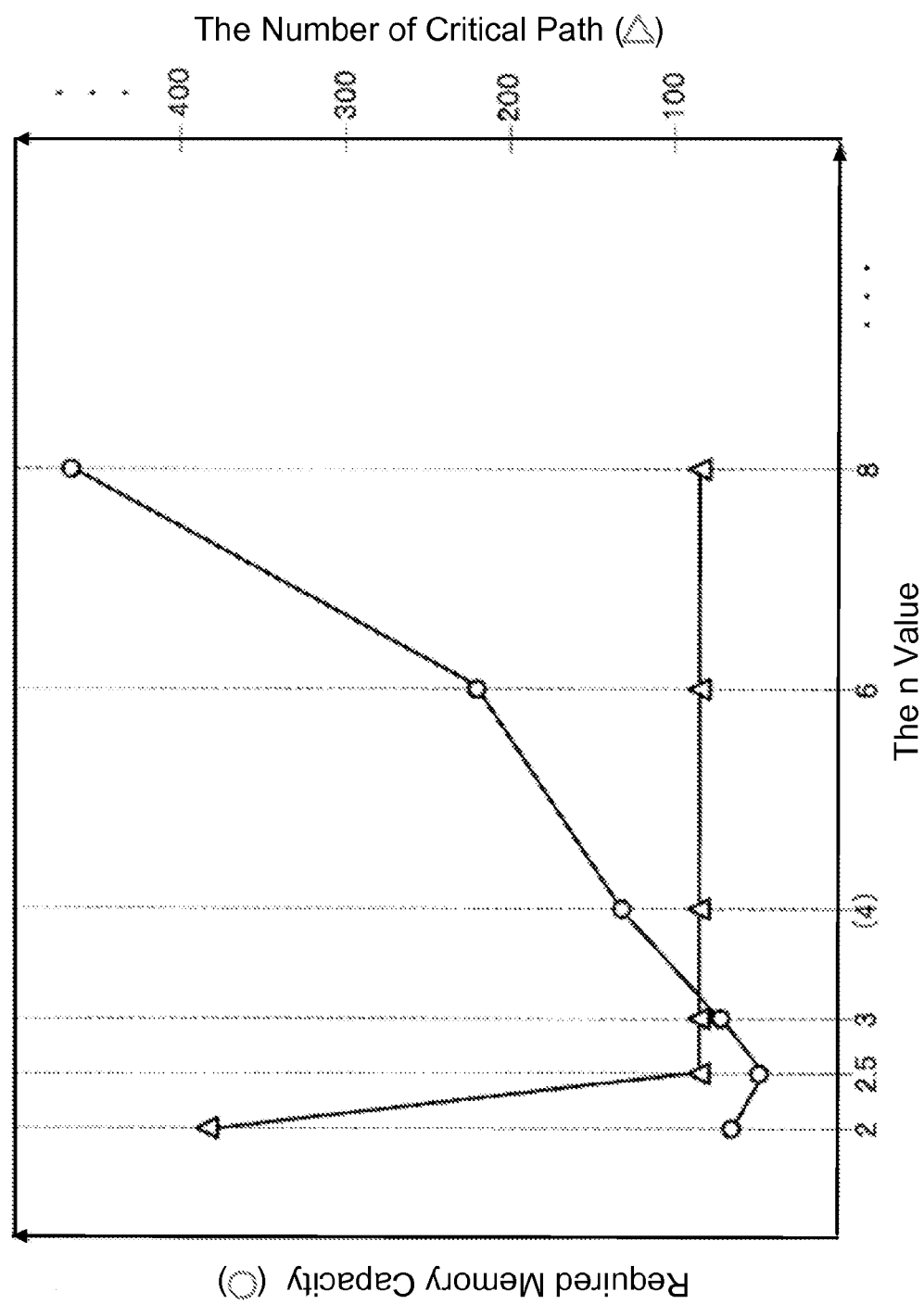
FIG. 16 is a chart that illustrates a comparison of the required amount of memory and the number of cells in a critical path.
Figure 17:
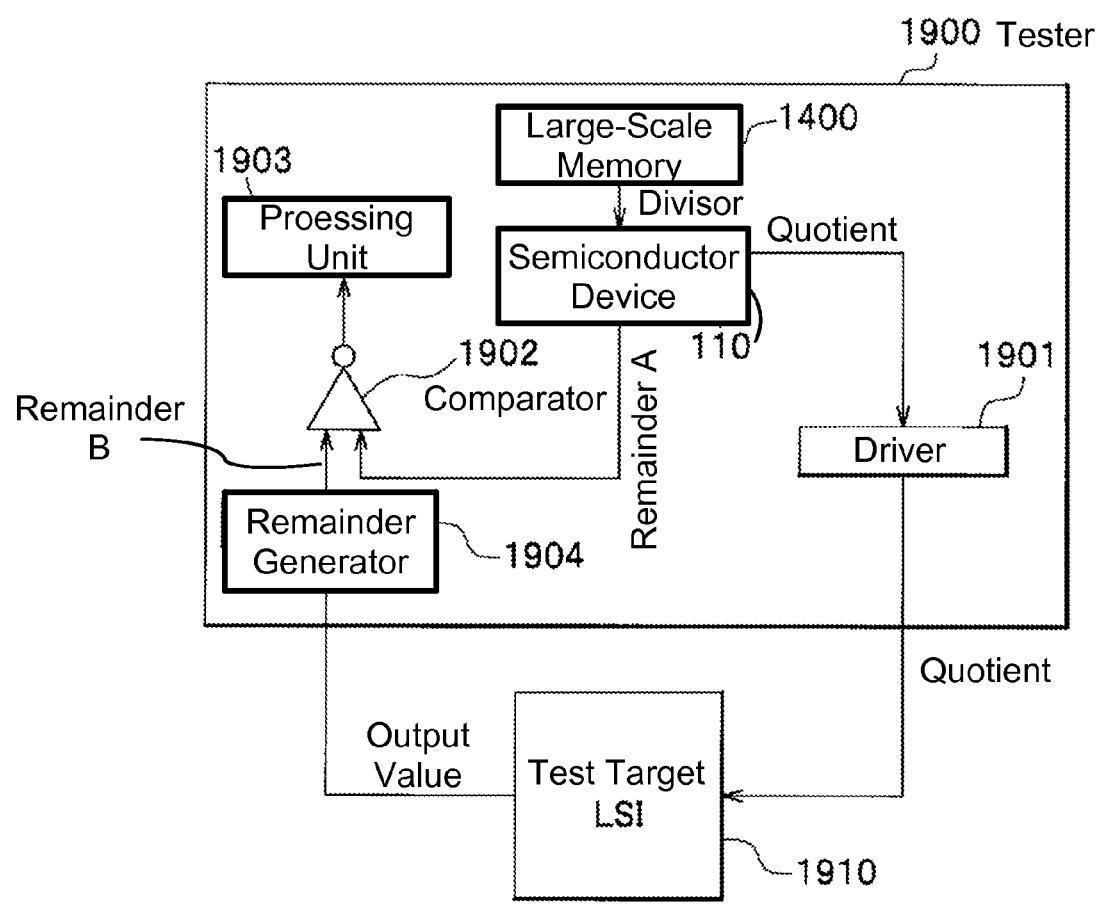
FIG. 17 is a configuration diagram of a tester that uses algebraic division.

With reference to FIG. 15 through FIG. 17, cases of algebraic division performed by the semiconductor device 110 are explained for the n value of "2," "2.5," "3," "6," and "8," respectively. Note that in the same manner as in the case of an adder described with reference to FIG. 6 through FIG. 9, an algebraic division function can be realized by the semiconductor device 110 when the n value is "2," "2.5," "3," "6," or "8." That is, in the semiconductor device 110, truth table data are stored in memory cells 200 such that each memory cell block 300 performs algebraic division in response to address inputs and outputs the resultant value as a random pattern.

FIG. 15 is a diagram that illustrates an example of algebraic division. Here, it should be noted that algebraic division is different from generally known division in which such a relation as "(dividend)=(divisor)×(quotient)+(remainder)" is satisfied. Instead, algebraic division here means division in which calculations of "1−1=0," "1−0=1," "0−1=1," and "0−0=0" are performed for each digit in the process of division–i.e., division without performing carrying or borrowing. By not involving carrying or borrowing, algebraic division makes calculations simple and is suitable for generating binary random patterns. Because it does not involve carrying or borrowing in the process of the calculations, an arithmetic rule such as "1+1=0" may be adopted instead of "1−1=0" (the result of the calculation is the same). The same applies to other arithmetic rules as well. Additionally, normal division may be performed instead of algebraic division to generate random patterns.

As shown in FIG. 15, according to this algebraic division, when dividend "10010011010010 . . . " is divided by divisor "1010," it yields quotient "0001011110001 . . . " with remainder "0110."

FIG. 16 is a chart that illustrates a comparison of the amount of required memory capacity and a comparison of the number of critical path in cases where algebraic division is performed by the semiconductor device 110 for the n value of "2," "2.5," "3," "6," and "8." Here, the number of critical path means the number of memory cell blocks 300 when the longest route is taken among memory cell blocks 300 used for calculations.

As described in FIG. 16, among the semiconductor devices 110 with the n value of "2," "2.5," "3," "6," and "8," the amount of required memory capacity is the smallest when the n value is "2.5" and becomes slightly larger when the n value is "2" and "3."

Meanwhile, the number of cells for critical path is nearly the same for all the n values except when the n value is "2" where the number is the largest.

This suggests that algebraic division is performed by the semiconductor device 110 most efficiently when the n value is "2.5" (the number of input/output in a memory cell block 300 is "5") or "3" (the number of input/output in a memory cell block 300 is "6").

If the area ratio of the sense amplifiers 600 to the entire semiconductor device 110 needs to be decreased, the n value may be set at "6" or "8," for example. That is, the n values can be freely and appropriately chosen according to various needs, such as the scale and speed of operations, the area ratio of the sense amplifier 600, and so forth.

Next, with reference to FIG. 17, a case where the semiconductor device is used for a tester that employs algebraic division is explained. FIG. 17 is a configuration diagram of the tester. A tester 1900 is a device that confirms an operation of a test target LSI 1910 (other semiconductor device).

The tester 1900 is constructed of a large-scale memory 1400 (storage device), a semiconductor device 110, a driver 1901, a comparator 1902, a processing unit 1903, and a remainder generator 1904.

The large-scale memory 1400 provides a divisor to the semiconductor device 110.

The semiconductor device 110 is composed of memory cells 200 that have been prearranged so as to correspond to a dividend.

Upon an input of the divisor, the semiconductor device 110 outputs a quotient (random pattern) to the driver 1901 and outputs a remainder A (the correct answer of the remainder) to the comparator 1902.

The driver 1901 is a driver circuit that receives the quotient from the semiconductor device 110 and sends a signal based on the quotient to the test target LSI 1910.

The test target LSI 1910 operates based on the quotient inputted from the driver 1901 and outputs an output value to the remainder generator 1904.

The remainder generator 1904 converts the output value inputted from the test target LSI 1910 into a remainder B.

The comparator 1902 is a comparator and compares the remainder A inputted from the semiconductor device 110 with the remainder B inputted from the remainder generator 1904.

The processing unit 1903 is a device that performs a processing in response to an output from the comparator 1902, and is realized by a CPU (Central Processing Unit), for example. The processing unit 1903 makes a judgment that the test target LSI1910 is "normal," when it receives an output from the comparator 1902 indicating that the remainder A and the remainder B are the same.

Also, although not shown in the figures, the tester 1900 may be equipped with a direct-current power source, a timing generator, and the like, as needed.

As described above, the semiconductor device 110 is applicable to a tester that employs algebraic division. Here, the semiconductor device 110 corresponds to a so-called pattern generator, and the remainder generator 1904 corresponds to a so-called pattern compressor.

Next, an operation program for the semiconductor device 110 is explained.

In a conventional manufacturing of FPGA, for example, a C language program is created, and HDL (Hardware Description Language) is created. Then, logic synthesis is performed from the HDL to create logic circuits. In accordance with the logic circuits, logic placement and placement wiring are performed on the subject FPGA. Thus, a complicated and highly-sophisticated process is required.

In contrast, the semiconductor device of the present embodiments is a memory and also a storage device, and therefore is capable of compiling a C language program to store data thereof as truth values, thereby making the work process simple and easy. Further, because the semiconductor device of the present embodiments is a storage device, it is capable of realizing different logic circuits simply by rewriting truth table data that are written in memory cells 200 without changing wirings.

Figure 18:
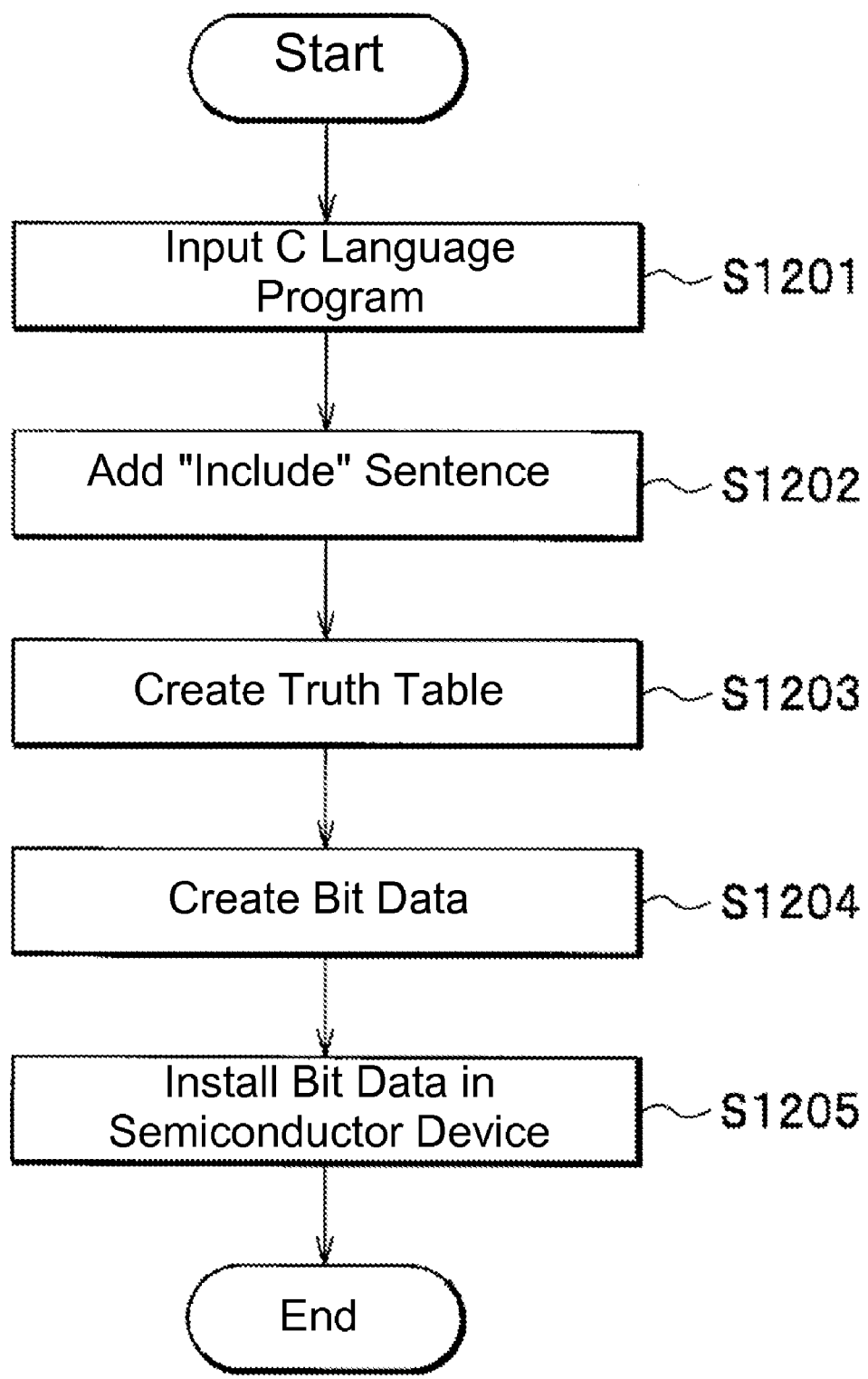
FIG. 18 is a flowchart that illustrates a processing flow when bit data are installed so that a semiconductor device can operate as a logic circuit.

This will be explained in more detail with reference to FIG. 18 (see FIG. 1 as necessary). FIG. 18 is a flowchart that illustrates a processing flow when bit data are installed in a semiconductor device so as to operate as a logic circuit.

First, an information processing device 100 inputs a C language program describing desired functions via an input unit 101 (step S1201) and store it in a storage unit 102.

Programs for various functions (such as addition and subtraction) have been stored in the storage unit 102 in advance.

An operator of the information processing device 100 uses the input unit 101 to add a declaration statement (Include sentence) so as to quote necessary programs among those stored in the storage unit 102 (step S1202).

The processing unit 106 creates a truth table (such as the truth table 601 shown in FIG. 7 and the like) based on the C language program to which the Include sentence has been added (Step S1203); creates bit data based on the truth table (step S1204); and installs the bit data in the semiconductor device 110 via the communication unit 105 (step S1205).

Thus, according to the semiconductor device 110 of the present embodiments, the work process required to make the semiconductor device 110 operate as a logic circuit is simplified.

As described above, according to the present embodiments, it is possible to realize a semiconductor device, which is a memory that operates as a logic circuit, in which truth values in the memory can be rewritten without reconnecting wirings, and by which data can be fed back.

In addition, since the semiconductor devices according to the present embodiments do not use actual logic circuits, they are capable of readily responding to (i.e., resolving) any problems that may occur in a part of the memory by avoiding the use of the defective part, for example.

Furthermore, according to semiconductor devices of the present embodiments, a plurality of memories can be used, and a test program can be installed in some of the plurality of memories so that one of the other memories can be tested. After the test is completed, the test program can be deleted from the memories that had stored the test program therein so that these memories can be used as regular memories.

Also, for a system LSI with a built-in memory, the built-in memory can be configured to have a structure of a semiconductor device of the present embodiments so that it can perform a self-test, and a test program written in the C language can be written in the memory to construct a test logic circuit so that other logic circuits in the system LSI can be tested.

Further, the number of sense amplifiers in a single memory cell block is not limited to two, but may be one, or three or more.

This concludes the description of the embodiments. However, it should be noted that embodiments of the present invention are not limited to those described above.

For example, semiconductor devices according to the present invention may be realized by using DRAM (Dynamic Random Access Memory) or flash memory in place of SRAM.

Also, there is no limitation to installation of functions for improving memory performance, such as recharge function and the like.

Furthermore, the memory cell may employ a so-called double gate system that uses two read word lines.

Other appropriate modifications are possible without departing from the sprit of the present invention.

What is claimed is:

1. A semiconductor device comprising a plurality of memory cell blocks that each contain a plurality of memory cells for storing a predetermined amount of data, wherein each of said memory cell blocks has four or more inputs and four or more outputs, and internally contains a read address decoder for said memory cells and a sense amplifier for amplifying a voltage for output operation to an exterior, each of said memory cell blocks being constructed to store truth table data in said memory cells so that a desired logic value is outputted in response to a specified address input, thereby operating as a logic circuit, wherein said memory cell has a read word line correspondingly to said read address decoder, and when a voltage is applied to the read word line, data that is held at that time is read from a read data line, and wherein said memory cell blocks are connected to each other such that the four or more outputs from one memory cell block are inputted to other four or more memory cell blocks through said sense amplifier.

2. The semiconductor device according to claim 1, wherein said memory cell block has five or six inputs and five or six outputs, and
   wherein the memory cell blocks are connected to each other such that said five or six outputs from one memory cell block are inputted to other four or more memory cell blocks through the sense amplifier.

3. The semiconductor device according to claim 1, wherein each of the said memory cell blocks stores truth table data in said memory cells so as to output, as random pattern, a value obtained as a result of division with respect to an address input.

4. The semiconductor device according to claim 1, wherein said plurality of memory cell blocks each have a rectangular shape of a substantially same size, and are connected to each other by shifting and arranging at least a part of an arrayed arrangement.

5. The semiconductor device according to claim 1, wherein said plurality of memory cell blocks are arranged in an arrayed manner and are connected to each other via wirings.

6. The semiconductor device according to claim 1, wherein a memory cell of the said memory cell block operates as a storage device when truth table data is not stored therein.

7. The semiconductor device according to claim 1, wherein the said memory cell block has two divided areas of operating memory cells, and
   wherein when a specific address select line for said read address decoder is switched, said areas of the operating memory cells are switched so that operations as two types of logic circuits can be switched instantaneously, or an operation as a logic circuit and an operation as a storage device can be switched instantaneously.

8. The semiconductor device according to claim 1, wherein when the truth table data stored in memory cells are rewritten in some of said plurality of memory cell blocks, an operation of the semiconductor device changes in accordance with the rewritten truth table data.

9. The semiconductor device according to claim 1, wherein the semiconductor devices constitutes a part of a system LSI, and
   wherein the semiconductor devices performs a self-test and a test of other logic circuits in the said system LSI.

10. The semiconductor device according to claim 1, wherein a compiling is performed in the semiconductor device by a C language program, which describes an operation.

\* \* \* \* \*